US011631782B2

United States Patent
Oliver et al.

(10) Patent No.: US 11,631,782 B2
(45) Date of Patent: Apr. 18, 2023

(54) METHOD FOR ELECTROCHEMICALLY ETCHING A SEMICONDUCTOR STRUCTURE

(71) Applicant: CAMBRIDGE ENTERPRISE LTD, Cambridge (GB)

(72) Inventors: Rachel A. Oliver, Cambridge (GB); Tongtong Zhu, Cambridge (GB); Yingjun Liu, Cambridge (GB); Peter Griffin, Cambridge (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 0 days.

(21) Appl. No.: 16/964,706

(22) PCT Filed: Jan. 25, 2019

(86) PCT No.: PCT/GB2019/050213
§ 371 (c)(1),
(2) Date: Jul. 24, 2020

(87) PCT Pub. No.: WO2019/145728
PCT Pub. Date: Aug. 1, 2019

(65) Prior Publication Data
US 2021/0057601 A1 Feb. 25, 2021

(30) Foreign Application Priority Data
Jan. 26, 2018 (GB) ...................................... 1801337

(51) Int. Cl.
H01L 33/06 (2010.01)
H01L 33/00 (2010.01)
(Continued)

(52) U.S. Cl.
CPC .......... *H01L 33/007* (2013.01); *H01L 33/025* (2013.01); *H01L 33/06* (2013.01); *H01L 33/105* (2013.01); *H01L 33/325* (2013.01)

(58) Field of Classification Search
CPC ............. H01L 21/30635; H01L 33/007; H01L 33/025; H01L 33/06; H01L 33/105;
(Continued)

(56) References Cited

U.S. PATENT DOCUMENTS 8,519,430 B2  8/2013  Peng et al.
9,070,827 B2  6/2015  Peng et al.
(Continued)

FOREIGN PATENT DOCUMENTS

CN  102782818 A  11/2012
CN  102782818 B  4/2016
(Continued)

OTHER PUBLICATIONS

Office Action issued for Japanese Patent Application No. 2020-517083, dated Nov. 2, 2021, 10 pages including machine translation.
(Continued)

Primary Examiner — Matthew C Landau
Assistant Examiner — Dmitriy Yemelyanov
(74) Attorney, Agent, or Firm — Hamre, Schumann, Mueller & Larson, P.C.

(57) ABSTRACT

A method for etching a semiconductor structure (110) is provided, the semiconductor structure comprising a sub-surface quantum structure (30) of a first III-V semiconductor material, beneath a surface layer (31) of a second III-V semiconductor material having a charge carrier density of less than $5 \times 10^{17}$ cm$^{-3}$. The sub-surface quantum structure may comprise, for example, a quantum well, or a quantum wire, or a quantum dot. The method comprises the steps of
(Continued)

exposing the surface layer to an electrolyte (130), and applying a potential difference between the first III-V semiconductor material and the electrolyte, to electrochemically etch the sub-surface quantum structure (30) to form a plurality of nanostructures, while the surface layer (31) is not etched. A semiconductor structure, uses thereof, and devices incorporating such semiconductor structures are further provided.

23 Claims, 7 Drawing Sheets

(51) Int. Cl.
  *H01L 33/02* (2010.01)
  *H01L 33/10* (2010.01)
  *H01L 33/32* (2010.01)

(58) Field of Classification Search
  CPC ....... H01L 33/18; H01L 33/32; H01L 33/325; H01S 5/18316; H01S 5/3412; H01S 5/34333
  See application file for complete search history.

(56) References Cited

U.S. PATENT DOCUMENTS

| | | | |
|---|---|---|---|
| 9,206,524 | B2 | 12/2015 | Zhang et al. |
| 9,276,382 | B2 | 3/2016 | Fischer et al. |
| 9,583,353 | B2 | 2/2017 | Han |
| 9,922,838 | B2 | 3/2018 | Dahal et al. |
| 10,458,038 | B2 | 10/2019 | Zhang et al. |
| 11,018,231 | B2 | 5/2021 | Han et al. |
| 11,095,096 | B2 | 8/2021 | Han et al. |
| 2012/0104455 | A1 | 5/2012 | Peng et al. |
| 2013/0011656 | A1* | 1/2013 | Zhang ............... G02B 5/1861 428/312.8 |
| 2013/0328102 | A1 | 12/2013 | Peng et al. |
| 2014/0003458 | A1* | 1/2014 | Han ..................... H01L 21/306 372/45.01 |
| 2014/0203292 | A1* | 7/2014 | Hwang ................ H01L 33/50 257/98 |
| 2015/0270136 | A1* | 9/2015 | Fischer ................. B82B 1/00 438/746 |
| 2015/0303655 | A1 | 10/2015 | Han et al. |
| 2016/0153113 | A1 | 6/2016 | Zhang et al. |
| 2017/0237234 | A1 | 8/2017 | Han et al. |

FOREIGN PATENT DOCUMENTS

| | | |
|---|---|---|
| CN | 105821435 A | 8/2016 |
| CN | 105821435 B | 10/2018 |
| EP | 3923352 A1 | 12/2021 |
| JP | 2000-106455 | 4/2000 |
| JP | 2005-129682 | 5/2005 |
| JP | 2006-513122 A | 4/2006 |
| JP | 2013-518447 A | 5/2013 |
| JP | 2013-173641 | 9/2013 |
| JP | 2014-507069 A | 3/2014 |
| JP | 2014-527707 A | 10/2014 |
| JP | 5763789 B2 | 8/2015 |
| JP | 5961557 B2 | 8/2016 |
| JP | 2018-502436 A | 1/2018 |
| JP | 2018-517295 A | 6/2018 |
| KR | 2014-0030135 A | 3/2014 |
| KR | 10-2014-0095390 | 8/2014 |
| KR | 101550117 B1 | 9/2015 |
| KR | 10-2017-0063919 | 6/2017 |
| TW | 201218419 A | 5/2012 |
| TW | 201234655 A | 8/2012 |
| TW | I431810 B | 3/2014 |
| TW | I451597 B | 9/2014 |
| WO | 2011/094391 | 8/2011 |
| WO | 2016/054232 | 4/2016 |
| WO | 2016/187421 | 11/2016 |
| WO | WO-2016187421 A1 * | 11/2016 ........... H01S 5/0213 |

OTHER PUBLICATIONS

Chen et al, "Nanopores in GaN by electrochemical anodization in hydrofluoric acid: Formation and mechanism," Journal of Applied Physics, 112, 064303 (2012).
C. Zhang, et al. "Mesoporous GaN for Photonic Engineering-Highly Reflective GaN Mirrors as an Example," ACS Photonics 2015, 2, 980.
Wang et al., "InGaN Quantum Dots by Quantum Size Controlled Photoelectrochemical Etching (Slides)," Sandia National Laboratories, 2016, 13 pages.
Zhu, T. et al., "Wafer-scale Fabrication of Non-polar Mesoporous GaN Distributed Bragg Reflectors via Electrochemical Porosification," Sci. Rep., vol. 7, 45344, 2017, pp. 1-8.
Braniste T. et al., "Multilayer porous structures of HVPE and MOCVD grown GaN for photonic applications", Superlattices and Microstructures, Academic Press, London, GB, vol. 102, Dec. 23, 2016 (Dec. 23, 2016), pp. 221-234.
P. 4 of PCT Request Form submitted on Sep. 27, 2017 in PCT/GB2017/052895, Section VIII-5-1 Declaration Non-prejudicial disclosure or exceptions to lack of novelty, 1 page.
International Search Report and Written Opinion issued for PCT/GB2017/052895, dated Jun. 26, 2018, 12 pages.
Pampili P. et al., "Doping of III-nitride materials," Materials Science in Semiconductor Pocessing 62 (2017) 180-191.
Zhu T. et al., "Unintentional doping in GaN," DOI: 10.1039/c2cp40998d Mar. 2012, 16 pages.
Office Action issued for Korean Patent Application No. 10-2020-7012100, dated Dec. 30, 2021, 12 pages including English translation.
Bing-Cheng Shieh, et al., "InGaN light-emitting diodes with embedded nanoporous GaN distributed Bragg reflectors," Applied Physics Express, vol. 8, No. 8, Jul. 8, 2015, pp. 1-4.
International Search Report and Written Opinion issued for PCT/GB2019/050213, dated Apr. 3, 2019, 15 pages.
Office Action issued for U.S. Appl. No. 16/651,055, filed May 27, 2022, 18 pages.
Notice of Allowance issued for Korean Patent Application No. 10-2020-7012100, dated Aug. 12, 2022, 3 pages including English translation.
Notice of Allowance issued for Japanese Patent Application No. 2020-517083, dated Apr. 5, 2022, 7 pages including machine translation.
Office Action issued for Japanese Patent Application No. 2022-009480, dated Dec. 6, 2022, 7 pages including machine translation.

\* cited by examiner

METHOD FOR ELECTROCHEMICALLY ETCHING A SEMICONDUCTOR STRUCTURE

The invention relates to a method for etching a semiconductor material, in particular a III-V semiconductor material, a semiconductor structure, use of a semiconductor structure, and a device incorporating or mounted on a semiconductor structure. In particular, the invention relates to a method of forming quantum dots in a semiconductor structure comprising a sub-surface quantum well, and to semiconductor structures and devices incorporating such semiconductor structures.

BACKGROUND

"III-V" semiconductors include binary, ternary and quaternary alloys of Group III elements, such as Ga, Al and In, with Group V elements, such as N, P, As and Sb), and are of great interest for a number of applications, including optoelectronics.

Of particular interest is the class of semiconductor materials known as "Ill-nitride" materials, which includes gallium nitride (GaN), indium nitride (InN) and aluminium nitride (AlN), along with their ternary and quaternary alloys. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties, for example its refractive index, without negatively affecting its electrical conductivity. The possibility of tuning the optical properties of GaN by altering its porosity therefore makes porous GaN of great interest for optoelectronic applications.

WO2011/094391A1 discloses the possibility of generating nanoporous GaN by an electrochemical etching method, whereby n-type doped GaN is etched to generate porosity by contacting the n-type doped GaN with an electrolyte and applying an etching potential. WO2011/094391A1 (paragraph [0031]) describes the etching of two types of GaN structure. In a first type, the surface of an exposed layer of n-type doped GaN is contacted with an electrolyte and etched, generating a porous layer. Etching proceeds perpendicularly to the layer surface and in WO2011/094391A1 is termed vertical etching. In a second type of structure a top layer of undoped GaN is formed over a layer of n-type doped GaN. The n-type doped GaN thus forms a sub-surface layer. The layers are then dry etched, or cleaved, to form trenches which expose edges or side-walls of the layers, and these edges can be exposed to an electrolyte. Etching then proceeds selectively through the n-type layer, from its exposed edge, porosifying the doped sub-surface layer but not the overlying undoped layer. In WO2011/094391A1 this is termed horizontal or lateral etching.

Electrochemical etching of n-type GaN has been further described in a variety of academic papers. All of these prior art documents follow the teaching of WO2011/094391A1 that etching can either be performed "vertically", directly into an exposed n-type GaN surface, or "horizontally", into the edges of an n-type GaN layer sandwiched between two layers of undoped GaN and/or an electrically insulating base layer.

Chen et al, *Journal of Applied Physics,* 112, 064303 (2012) relates to vertical etching of n-type GaN, and describes the use of an underlying undoped GaN layer of 500 nm thickness as an "etch stop" to prevent further etching. Chen et al further notes that vertical etching caused surface pits to be formed in the surface of the n-type GaN.

C. Zhang, et al. *ACS Photonics* 2015, 2, 980, on the other hand, discloses horizontally etching a multi-layer structure consisting of alternate layers of undoped GaN and n-type GaN. In order to allow horizontal etching, the multi-layer sample was first lithographically patterned with trenches at intervals of 50 µm, in order to expose the edges or side-walls of the layers, and allow electrolyte transport horizontally into the n-type layers during porosification. An electrically insulating layer of $SiO_2$ was also formed as a protective layer on top of the uppermost layer of undoped GaN.

Horizontal, or lateral, etching from the edge of a sub-surface layer is limited by factors including the diffusion rate of electrolyte into and out of the layer during etching, meaning that there is a limit to the distance from an edge of a layer that can be etched, and therefore that there is a limit to the width of a sample that can be porosified by horizontal etching (if etched from opposite edges).

The authors of the prior art have addressed this sample-size limitation by dry-etching vertical trenches into samples prior to etching, so that the edges of the sample layers are exposed at regular intervals. This allows the electrolyte to contact the layer edges and etch horizontally into the sample structure. Dry-etching trenches means that each sample is effectively divided up into a plurality of smaller samples extending between adjacent trenches. The distance between adjacent trenches is naturally limited to twice the distance (assuming that a sample is horizontally etched from both sides) that it is possible for horizontal etching to penetrate into a layer. In C. Zhang, et al, for example, sample width for horizontal etching is limited to dimensions of 50 µm between trenches.

This additional processing step both increases the cost of wafer processing, and limits the maximum dimension of the resulting porosified structure. Dividing semiconductor structures into small mesas by dry-etching trenches may also make the resulting porosified structure unsuitable for use in fabrication of certain semiconductor devices. This technique may therefore limit the viability of horizontal etching methods, and their resulting structures, for practical optoelectronic devices on a large scale.

Furthermore, the horizontal etching methods of the prior art include the application of a relatively thick dielectric layer on top of the semiconductor structure prior to etching. This dielectric layer, which is frequently formed from silica ($SiO_2$), covers the surface layer and prevents the electrolyte from contacting the surface layer of the sample during etching. This layer acts as a mask to protect the surface layer from damage, either during dry-etching of trenches, or during the horizontal etching process. The application of this layer, and its subsequent removal if necessary, introduces yet further processing steps and constrains the material design.

The present invention relates to the formation of nanostructures, such as quantum dots, in semiconductor structures using electrochemical etching.

In U.S. Pat. No. 9,276,382B2 Sandia National Laboratories ("Sandia") disclosed a method of producing quantum dots in an InGaN quantum well layer by using a photoelectrochemical etching (PEC) technique. Sandia states in U.S. Pat. No. 9,276,382B2 that "wet chemical etching has only been accomplished at high temperatures with low etching rate, and without selectivity between the composited layer structures". Sandia's technique therefore requires illumination of the material to be etched with narrowband light throughout the etching process. In order to ensure that only photo-induced PEC processes, and no "dark" electrochemical etching, can occur, Sandia intentionally restricts the etching voltages to less than 2 volts (V), at which voltage they state that no "dark" electrochemistry can occur (col 10 lines 30 to 54 of U.S. Pat. No. 9,276,382B2).

Like WO2011/094391A1, Sandia's PEC technique involves two possible approaches to etching. On approach is to PEC etch a surface layer of semiconductor material (col 12, lines 47 to 57 of U.S. Pat. No. 9,276,382B2). Another approach is to etch a sandwiched quantum well layer by "lateral" etching inwards from the sides of the quantum well (col 12, line 64 to col 13 line 36 of U.S. Pat. No. 9,276, 382B2). After 5 minutes of lateral PEC etching, Sandia's quantum wells were etched laterally inwards by about 2 nm, but the barrier layers sandwiching the quantum well were also unintentionally partially etched (col 13 lines 20 to 22 of U.S. Pat. No. 9,276,382B2).

Sandia has discussed their PEC technique further in other publications, such as Wang et al., *InGaN Quantum Dots by Quantum Size Controlled Photoelectrochemical Etching (Slides), Sandia National Laboratories*. In Wang et al., Sandia discloses an attempt to PEC etch a 3 nm thick InGaN quantum well covered by a 10 nm-thick "GaN cap" surface layer. Wang et al. states that the PEC "etch appears to break through GaN cap", with an accompanying Figure (included as FIG. 1, below) showing holes etched completely through the GaN cap to expose the quantum well layer below. Where the layer to be etched is not provided as an exposed surface layer, Sandia's PEC technique has therefore been found to result in damage to the surface layer, similarly to the prior art techniques described above. This etching of the GaN cap surface layer is sometimes described as "vertical etching" in disclosures of Sandia's PEC technique, and is stated to be undesirable but unavoidable, as it damages the surface layer and exposes the layer underneath.

SUMMARY OF THE INVENTION

The invention provides a method for etching a semiconductor structure, a semiconductor structure, use of a semiconductor structure, and a device incorporating or mounted on a semiconductor structure, as defined in the appended independent claims to which reference should now be made. Preferred or advantageous features of the invention are set out in dependent subclaims.

According to a first aspect of the invention there is provided a method for etching a semiconductor structure. The semiconductor structure comprises a sub-surface quantum structure of a first III-V semiconductor material, beneath a surface layer of a second III-V semiconductor material having a charge carrier density of less than $5 \times 10^{17}$ $cm^{-3}$. The method comprises the steps of exposing the surface layer to an electrolyte, and applying a potential difference between the first III-V semiconductor material and the electrolyte, to electrochemically etch the sub-surface quantum structure to form a plurality of nanostructures, while the surface layer is not etched.

Quantum Structures

The term "quantum structure" defines a semiconductor structure by relation to its electronic properties, such as its energy band structure.

A quantum structure is a structure which exhibits quantum confinement of charge carriers (electrons or holes) by confining them to a region which is restricted in at least one dimension. Quantum confinement occurs when charge carriers are restricted in at least one dimension on a length scale of the order of the de Broglie wavelength of the charge carriers in the material.

This quantum confinement leads to quantization of the component of the charge carrier wavefunction in the direction perpendicular to the restricted dimension of the quantum structure. The charge carrier can achieve a range of energies, which are defined by a step function density of states. However, all the available electron states are at a higher energy than the conduction band edge and all the available hole states are at a lower energy than the valence band edge. This offset is sometimes called the confinement energy and leads to a blueshift in emission from a quantum structure relative to the bulk material.

In order to create the electronic properties which characterise a quantum structure, a quantum structure must comprise a narrow bandgap portion which is restricted in size in at least one dimension. The energy bandgap of the quantum structure must be narrower than that of the surrounding material.

A quantum structure may exhibit quantum confinement by restricting charge carriers to a planar, two-dimensional, region, instead of a classical three-dimensional region. This form of quantum structure restricts charge carriers in one dimension. Charge carriers are free to move in two dimensions, so this may be termed a "two-dimensional" quantum structure, a planar quantum structure, or a "quantum well". In order for quantum confinement to occur in a planar region, the thickness of the planar region must be similar to the de Broglie wavelength of the charge carriers in the material.

Quantum wells are typically formed as thin, flat layers, in which the vertical dimension, or "thickness", of the layer is of the order of a few nanometres, and is much smaller than the other lateral dimensions of the layer. Quantum wells are typically structured as a thin layer of (relatively) narrow bandgap material sandwiched on both sides by (relatively) wider bandgap material. Quantum confinement occurs when the thickness of the narrow bandgap "quantum well" layer is of the order of the de Broglie wavelength of the charge carriers in the material.

In practice, quantum wells typically consist of thin layers of semiconductor material with a thickness of up to about 10 nanometers (nm), sandwiched between two "barrier" layers with a bandgap wider than that of the quantum well.

In the present invention, the "quantum structure" to be etched is not restricted in its physical size or shape. The method of the present invention is suitable for etching a quantum structure of any size or shape, as long as it exhibits the quantum confinement typical of a quantum structure.

Thus, in the present invention the quantum structure may be a "two-dimensional" quantum structure, or "quantum well", in which charge carriers can move freely in two dimensions, and quantum confinement occurs in one dimension. For example, the quantum well may comprise a layer extending laterally over a portion of, or all of, the semiconductor structure.

The quantum structure in the present invention may be a "one-dimensional" quantum structure, in which charge carriers can move freely in one dimension, and quantum confinement is exhibited in two dimensions. Where two of the dimensions of the quantum structure are on the order of the de Broglie wavelength of the charge carriers, the quantum structure may be considered to provide quantum confinement in two dimensions. For example, the quantum structure may be formed as a relatively long, narrow, thin strip, so that quantum confinement is achieved in both the "vertical" dimension and one "lateral" dimension. This quantum structure may be termed a "quantum wire".

Where all three of the dimensions of the quantum structure are on the order of the de Broglie wavelength of the charge carriers, the quantum structure may be considered to provide quantum confinement in three dimensions. Such a quantum structure may be a "zero-dimensional" quantum structure, in which charge carriers can move freely in zero dimensions. A zero-dimensional quantum structure may be termed a "quantum dot".

The sub-surface quantum structure may thus comprise one or more quantum wells, quantum wires, or quantum dots.

Planar quantum wells, quantum wires and quantum dots may be classed as "quantum structures" for the purposes of this invention, as they may be etched by the present method.

The sub-surface quantum structure preferably has a minimum lateral dimension which is at least 2 times, or 5 times, or 10 times, or 50 times, or 100 times, or 1000 greater than its thickness.

The sub-surface quantum structure preferably has one or more dimensions of less than or equal to 0.25 nm, or 0.5 nm, or 1 nm, or 2 nm, or 3 nm, or 5 nm, or 8 nm, or 10 nm, or 12 nm.

Where the quantum structure is a quantum well, the quantum well may have one dimension of less than or equal to 0.25 nm, or 0.5 nm, or 1 nm, or 2 nm, or 3 nm, or 5 nm, or 8 nm, or 10 nm, or 12 nm.

Where the quantum structure is a quantum wire, the quantum well may have two transverse dimensions of less than or equal to 0.25 nm, or 0.5 nm, or 1 nm, or 2 nm, or 3 nm, or 5 nm, or 8 nm, or 10 nm, or 12 nm.

Where the quantum structure is a quantum dot, the quantum well may have three transverse dimensions of less than or equal to 0.25 nm, or 0.5 nm, or 1 nm, or 2 nm, or 3 nm, or 5 nm, or 8 nm, or 10 nm, or 12 nm.

The sub-surface quantum structure preferably has a thickness greater than or equal to 1 nm, or 2 nm, or 3 nm, or 5 nm, and/or less than 6 nm, or 7 nm, or 8 nm, or 9 nm, or 10 nm, or 12 nm.

The quantum structure is preferably formed by epitaxial growth.

The semiconductor structure may comprise one or more quantum structures. One or more quantum structures may be arranged in the same plane, so that the one or more quantum structures are considered to be in the same "layer" of the semiconductor structure. Alternatively, one or more quantum structures may be provided at different heights in the semiconductor structure.

The or each sub-surface quantum structure is preferably positioned between a first barrier layer of III-V semiconductor material, and a second barrier layer of III-V semiconductor material, in which the electronic bandgap of the sub-surface quantum structure is narrower than the bandgap of the first and second barrier layers.

Etching the Quantum structure

The method of the present invention forms nanostructures in the quantum structure by electrochemical etching.

The present invention advantageously allows selective etching of the quantum structure layer in a multi-layer semiconductor structure, so that nanostructures are formed in the quantum structure layer while the rest of the semiconductor structure remains intact.

The quantum structure may be formed from doped III-V semiconductor material with a charge carrier density of greater than $5 \times 10^{17}$ cm$^{-3}$, or $1 \times 10^{18}$ cm$^{-3}$, or $5 \times 10^{18}$ cm$^{-3}$, or $1 \times 10^{19}$ cm$^{-3}$. If the quantum structure is formed from doped III-V semiconductor material with a sufficiently high charge carrier density, the quantum structure may advantageously be electrochemically etched without the necessary presence of any other doped semiconductor material in the semiconductor structure.

In a preferred embodiment of the invention, the semiconductor structure additionally comprises a further sub-surface structure of a third III-V semiconductor material having a charge carrier density of greater than $1 \times 10^{17}$ cm$^{-3}$, or greater than $5 \times 10^{17}$ cm$^{-3}$.

The inventors of the present invention theorise that the presence of the further sub-surface structure of a third III-V semiconductor material having a charge carrier density of greater than $1 \times 10^{17}$ cm$^{-3}$ beneath the quantum structure enables selective electrochemical etching of the quantum structure, even if the first III-V material of the quantum structure is undoped.

The inventors theorise that this further sub-surface structure is able to provide charge carriers to the quantum structure which enable electrochemical etching even if the material of the quantum structure is undoped. Due to the inherent electronic band structure of the quantum structure, it is energetically favourable for charge carriers in the further sub-surface structure of third III-V semiconductor material to flow to the quantum structure.

These charge carriers may thus be thought of as being "donated" to the quantum structure by the further sub-surface structure. It is thought that the presence of these "donated" charge carriers in the quantum structure enables electrochemical etching to take place in the quantum structure when a potential difference is applied.

The further sub-surface structure having a charge carrier density of greater than $1 \times 10^{17}$ cm$^{-3}$ may also function to spread current throughout the semiconductor structure during the etching process. This may advantageously allow the quantum structure to be etched evenly during the etching process.

The presence of the further sub-surface structure in the semiconductor structure with the quantum structure may thus enable the etching of the quantum structure regardless of the charge carrier density of the quantum structure itself.

The further sub-surface structure of the third III-V semiconductor material may be a second quantum structure. For example, the further sub-surface structure may be a second quantum well comprising doped semiconductor material.

The further sub-surface structure of the third III-V semiconductor material may be a non-quantum structure, which does not exhibit quantum confinement.

The further sub-surface structure of the third III-V semiconductor material may have a thickness less than or equal to 0.25 nm, or 0.5 nm, or 1 nm, or 2 nm, or 3 nm, or 5 nm, or 10 nm, or 12 nm, or 50 nm, or 100 nm, or 500 nm, or 1 μm, or 5 μm, or 10 μm.

The further sub-surface structure of a third III-V semiconductor material may be positioned in the semiconductor structure above or below the quantum structure. Preferably the quantum structure is arranged above the sub-surface structure of third III-V semiconductor material.

If the further sub-surface structure of a third III-V semiconductor material is above the quantum structure the further structure will be etched first, as etching proceeds downwards into the structure from the surface layer. After etching the further sub-surface structure, the etching would continue down to and start etching the quantum structure, until there is nothing conductive enough to be etched.

Preferably the charge carrier density of the third III-V semiconductor material is at least 5 times, or 10 times, or 100 times, or 1000 times, or 10,000 times, or 100,000 times, or 1,000,000 times higher than the charge carrier density in the surface layer. Such a charge carrier density may advantageously enable the further sub-surface structure to donate charge carriers to the quantum structure to enable etching.

Unlike most thicker layers of semiconductor material, a quantum structure represents an energy minimum and will thus trap charge carriers if they are available in the vicinity. If the semiconductor structure does not have the energy minimum of a quantum structure, then it will not be able to trap charge carriers from elsewhere in the structure (in the sub-surface structure in this case). Thus a non-quantum structure layer of semiconductor material which does not result in an energy minimum cannot achieve the necessary carrier density for etching unless the layer in question is doped to give it a high enough carrier density.

In the case of a much wider layer of narrow bandgap material, this approach is unlikely to provide sufficient carriers per unit volume throughout the narrow bandgap layer. This may be partly because the volume of the layer is larger, and partly because there are mechanisms which tend to prevent the spreading of charge carriers throughout such layers in III-nitride semiconductor materials.

Nanostructures

During electrochemical etching, material is removed from the first III-V semiconductor material making up the quantum structure, and pores may be formed in the quantum structure. The formation of these pores, and the removal of semiconductor material from the quantum structure, causes the formation of nanostructures in the previously-solid material of the quantum structure.

The nanostructures formed in the quantum structure may comprise a complex network of columns, passageways, and segments of the first III-V material, separated by the pores formed by the etching process. The nanostructures are the structures formed from the material which is left over after etching, from what was previously the quantum structure.

While the un-etched quantum structure was confined in at least one dimension in order to exhibit quantum confinement, the removal of semiconductor material throughout the quantum structure means that the remaining portions of nanostructured material are on the nanometre scale in all three dimensions. The nanostructures therefore exhibit quantum confinement in all three dimensions.

Quantum confinement of the charge carrier wavefunction in all three directions results in the formation of discrete energy levels in the quantum structure, so that charge carriers can only have discrete energy values.

The electrochemical etching process thus causes a transition from a quantum structure, in which quantum confinement is exhibited in at least one dimension, to nanostructures which exhibit quantum confinement in all three dimensions.

The "nanostructures" may alternatively be called zero-dimensional nanostructures, or structures which exhibit quantum confinement in all three dimensions.

Nanostructures which exhibit quantum confinement in three dimensions may alternatively be termed "quantum dots".

Thus, the nanostructures described in the present application may alternatively be termed quantum dots.

If the un-etched quantum structure is a "zero-dimensional" quantum structure, or quantum dot, which already exhibits three-dimensional quantum confinement before etching, the zero-dimensional quantum structure will still be etched to form nanostructures. The nanostructures formed will naturally be smaller in size than the original, pre-etching, quantum structure, but may also be termed "quantum dots" due to their quantum confinement in three dimensions. Etching a quantum dot may increase the degree of confinement of charge carriers within the quantum dot by decreasing the size of the quantum dot, which may advantageously lead to a shift in the emission spectrum of the quantum dot.

There are several potential benefits of introducing nanostructures into the active region of a III-V optoelectronic device, such as a nitride optoelectronic device.

Firstly, some technologically significant III-V semiconductor materials contain high densities of defects which act as non-radiative centres. This is the case, for example, with III-nitride materials. Nanostructuring in the plane of the quantum structure can prevent charge carrier diffusion to these defects, preventing non-radiative recombination and increasing the efficiency of the device.

Secondly, where nanostructures or quantum dots are formed, the electron and hole charge carriers may be forced into a smaller volume of semiconductor material, increasing their overlap integral and hence increasing the rate of radiative recombination, which again increases device efficiency.

Thirdly, in the nitrides, strain results in the generation of internal electric fields in heterostructures, which act to decrease the rate of radiative recombination. The formation of porous nanostructures specifically may allow elastic relaxation of that strain, providing an additional mechanism to reduce non-radiative recombination.

Further, the additional confinement in nanostructures, such as zero-dimensional quantum dots, can result in a blue shift of the emission spectrum.

For the growth of III-nitride semiconductor structures emitting in the ultra-violet, this blue shift pushes the emission wavelength further into the ultra-violet. Since the difficulty of growing good quality III-nitride material increases with decreasing wavelength across the ultra-violet region, this may advantageously provide a route to overcome the growth challenges associated with ultra-violet emission.

Method for Etching a Semiconductor

The method of the present invention may alternatively be termed a method for, or of, sub-surface etching of a quantum structure in a III-V semiconductor material. The method may be termed a method of forming nanostructures by etching a quantum structure in a semiconductor structure. As sub-surface III-V material may be selectively etched depending on its electronic band structure, such a method may be a method of selectively etching a quantum structure of III-V semiconductor material.

The method of the present invention may be a method for making an LED.

The sub-surface quantum structure may be provided in a desired arrangement, or pattern, beneath the surface layer. Preferably the sub-surface quantum structure forms a sub-surface layer beneath the surface layer. Particularly preferably the sub-surface quantum structure forms a continuous, or unbroken, sub-surface layer beneath the surface layer.

The sub-surface quantum structure may advantageously be porosified by electrochemical etching through the surface layer. That is, the method may be a method of through-layer, or through-surface, porosification.

Unlike in the prior art, in the present method it is not necessary to expose the III-V semiconductor material that is to be etched to the electrolyte. In WO2011/094391A1, for example, both "horizontal" etching and "vertical" etching require that an edge or surface of the layer to be etched is exposed to the electrolyte. Where the top surface of n-type doped GaN is exposed, "vertical" etching occurs down into the layer. Where only side-walls or edges of the n-type doped layers are exposed to the electrolyte, "horizontal" etching occurs inwardly into those exposed edges.

The present method allows etching by exposing the surface layer of III-V semiconductor material, which has a charge carrier density of less than $5 \times 10^{17}$ cm$^{-3}$, to the electrolyte. However, it is not necessary to expose the sub-surface quantum structure (the material that is to be etched) to the electrolyte.

The step of exposing the surface layer to an electrolyte may alternatively be described as contacting the surface layer with an electrolyte. Preferably the upper, top, or outermost, surface of the surface layer is exposed to the electrolyte. Particularly preferably only the surface layer is exposed to the electrolyte.

In the prior art, where the surface layer of nominally "undoped" GaN is masked by a layer of dielectric material such as $SiO_2$, the top surface of the surface layer is not exposed to the electrolyte.

The surface layer may cover only the upper surface of the sub-surface quantum structure. In other words, the sub-surface quantum structure may be arranged below, or underneath, the surface layer, or the surface layer may be arranged over the sub-surface quantum structure. The side-walls, or edges, of the sub-surface structure may be exposed, that is, not covered by the surface layer.

Alternatively, the sub-surface quantum structure may be completely covered by the surface layer. That is, both the upper surface and the side-walls, or edges, of the sub-surface quantum structure may be covered by the surface layer. Thus, if a structure formed from the sub-surface quantum structure and the surface layer were to be completely immersed in electrolyte, the surface layer may be the only material exposed to the electrolyte.

While the prior art has disclosed the use of undoped GaN as an "etch stop" which halts the progress of electrochemical etching, the inventors have found that the use of a surface layer of GaN, or other III-V or III-nitride material, having a charge carrier density of less than $5 \times 10^{17}$ cm$^{-3}$, or preferably less than $1 \times 10^{17}$ cm$^{-3}$, allows electrochemical etching to take place through the surface layer of the second III-V material. In other words, a sub-surface quantum structure can be porosified by etching through the surface layer, without directly contacting the sub-surface quantum structure with the electrolyte, and without etching the surface layer itself.

By controlling the charge carrier density of the surface layer and the sub-surface structure, as well as the thickness and composition of the sub-surface quantum structure, which in turn control its electronic band structure, the inventors have found that a sub-surface quantum structure of first III-V material can be porosified through a surface layer without the surface layer itself being porosified.

Particularly advantageously, the sub-surface quantum structure can be electrochemically etched without the surface layer being damaged or roughened during the etching process. Thus, the method of the present invention may advantageously allow the selective porosification of a complex (eg. multi-layered) III-V structure without having to apply a protective electrically conductive layer, of $SiO_2$ for example, onto the surface layer. This may eliminate the need for the time-consuming and costly extra processing steps of applying, and subsequently removing, a protective top layer that are required by the prior art before the porous structure can be used.

The surface layer may have a charge carrier density of between $1 \times 10^{14}$ cm$^{-3}$ and $5 \times 10^{17}$ cm$^{-3}$, or between $1 \times 10^{14}$ cm$^{-3}$ and $1 \times 10^{17}$ cm$^{-3}$. The surface layer may have a charge carrier density of at least $5 \times 10^{14}$ cm$^{-3}$, or $1 \times 10^{15}$ cm$^{-3}$, or $5 \times 10^{15}$ cm$^{-3}$, and/or less than $7 \times 10^{15}$ cm$^{-3}$, or $1 \times 10^{16}$ cm$^{-3}$, or $5 \times 10^{16}$ cm$^{-3}$, or $8 \times 10^{16}$ cm$^{-3}$, or $1 \times 10^{17}$ cm$^{-3}$, or less than $2 \times 10^{17}$ cm$^{-3}$, or less than $3 \times 10^{17}$ cm$^{-3}$, or less than $4 \times 10^{17}$ cm$^{-3}$ so that the surface layer is not porosified during etching.

If the charge carrier density of the surface layer is below $1 \times 10^{14}$ cm$^{-3}$, the surface layer may be too electrically resistive to allow electrochemical etching through the surface layer, as there are not enough charge carriers present to carry current to the sub-surface structure to be porosified.

If the charge carrier density of the surface layer is above $5 \times 10^{17}$ cm$^{-3}$, however, the surface layer may be sufficiently electrically conductive that the surface layer is itself etched during the electrochemical etching process. Thus, the surface layer may experience porosification, "pitting" in its surface, and/or roughening that makes the surface layer unsuitable for further processing, for example further epitaxial overgrowth. This may occur where the impurity concentration in the surface layer is too high, so that the surface layer has a charge carrier density of above $5 \times 10^{17}$ cm$^{-3}$, even though the layer may not have been intentionally doped.

In a preferred embodiment, the surface layer has a charge carrier density of less than $1 \times 10^{17}$ cm$^{-3}$.

The inventors have found that III-V semiconductor material having a charge carrier density greater than $5 \times 10^{17}$ cm$^{-3}$ may be etched by the method of the present invention. The inventors have found that III-V semiconductor material with a charge carrier density of less than $1 \times 10^{17}$ cm$^{-3}$ may advantageously not be etched in the range of etching voltages suitable for the present invention. For III-V semiconductor material with a charge carrier density between $1 \times 10^{17}$ cm$^{-3}$ and $5 \times 10^{17}$ cm$^{-3}$ etching may be possible at etching voltages above about 12 V, but may be avoided by using etching voltages below 12 V, or below 11 V, or below 10 V, or below 8 V.

In a preferred embodiment, the surface layer comprises p-type III-V semiconductor material with a charge carrier density of between $1 \times 10^{17}$ cm$^{-3}$ and $5 \times 10^{17}$ cm$^{-3}$. Particularly preferably the surface layer comprises p-type III-nitride semiconductor material with a charge carrier density of between $1 \times 10^{17}$ cm$^{-3}$ and $5 \times 10^{17}$ cm$^{-3}$. In this embodiment, etching voltages below 12 V, or below 10 V, or below 8 V are preferably used to achieve etching of the quantum structure through the surface layer, without etching the p-type surface layer.

By controlling the charge carrier densities of the layers, and the contrast in charge carrier density between adjacent layers, it is possible to pre-determine the layers which will be porosified by electrochemical etching.

The sub-surface quantum structure may be undoped, or the sub-surface quantum structure may be intentionally doped. The quantum structure may have a charge carrier density of at least $1 \times 10^{17}$ cm$^{-3}$, or $5 \times 10^{17}$ cm$^{-3}$, or at least $1 \times 10^{18}$ cm$^{-3}$, or at least $5 \times 10^{18}$ cm$^{-3}$, or at least $1 \times 10^{19}$ cm$^{-3}$, or at least $5 \times 10^{19}$ cm$^{-3}$, or at least $1 \times 10^{20}$ cm$^{-3}$, and/or less than $1 \times 10^{21}$ cm$^{-3}$, or $5 \times 10^{21}$ cm$^{-3}$, or $1 \times 10^{22}$ cm$^{-3}$.

In order to avoid damage to "undoped" surface layers, the authors of the prior art have found it necessary to apply protective dielectric layers to the top surfaces of their samples.

The skilled person will appreciate that the term "undoped" is relatively imprecise in semiconductor technology, as practically speaking, all semiconductor material contains inherent impurities which can be thought of as "dopant" atoms. Different methods of semiconductor growth may produce different levels of impurity, and thus different inherent charge carrier concentrations. Where impurity levels are high, the resulting semiconductor material may have a charge carrier density of above $1\times10^{17}$ cm$^{-3}$, or above $5\times10^{17}$ cm$^{-3}$, even though the layer has not been intentionally doped.

Thus, the reason that the authors of the prior art have found it necessary to apply protective dielectric layers to prevent undesired etching of surface layers may be that their "undoped" surface layers in fact have a charge carrier density of above $1\times10^{17}$ cm$^{-3}$, or above $5\times10^{17}$ cm$^{-3}$, such that the surface layers were themselves etched, or partially etched, on application of a potential difference. By applying a dielectric layer to the top of the surface layer the surface layer is protected from accidental etching regardless of its charge carrier concentration.

The presence of an electrically insulating layer on the outer surface of the surface layer would prevent electrical conduction through the surface layer to the sub-surface structure(s) below, so would prevent electrochemical etching through the surface layer.

Coating the outer surface of the surface layer in a dielectric material, as has been done in the prior art, may force etching to proceed horizontally, into the exposed edges of layers. The authors of the prior art have found that, by doing this, only the n-type doped GaN layers were porosified, while "undoped" GaN layers were not porosified, and acted as "etch stops".

The inventors of the present invention hypothesise that, in the prior art, horizontal etching proceeds selectively into exposed edges of the "n-type" layers because these layers offer the path of lowest electrical resistance. Thus, even if the nominally "undoped" GaN layers of the prior art in reality have a charge carrier density of above $1\times10^{17}$ cm$^{-3}$, horizontal etching would preferentially proceed into the "n-type" layers as long as these layers have a higher charge carrier density, and thus a higher electrical conductivity, than the "undoped" layers.

When the electrolyte is in contact with the exposed top surface of the surface layer, this "path of lowest resistance" behaviour is not possible. The charge carrier concentration of the surface layer must therefore be controlled so that etching through the surface layer can take place, but without causing damage to or porosification of the surface layer itself.

Thus, the method of the present invention may advantageously provide a method of porosifying sub-surface quantum structures with fewer processing steps than are necessary in the methods of the prior art, and which may advantageously be able to porosify large sample sizes without the need for pre-etching trenches.

The method of the present invention may advantageously provide a method of porosifying sub-surface quantum structures without damaging the surface layer in the manner exhibited by Sandia's PEC method, as shown in FIG. 1.

Preferably one or more of the first, second, third and any other III-V semiconductor materials present in the semiconductor structure, comprises a III-nitride material.

One or more of the first, second, third, or any other III-V semiconductor material in the structure may be different III-V semiconductor materials.

One or more of the first, second, third, or any other III-V semiconductor material in the structure may be the same III-V semiconductor material.

The chemical formula of the material forming different layers or structures may be the same. Different portions of the structure may be formed from the same type of material, but with different charge carrier densities. Different portions of the structure may be formed from the same type of material, but with one portion forming a quantum structure, and another portion not forming a quantum structure.

Preferably one or more of the the first, second and third III-V semiconductor materials forming the sub-surface quantum structure, the surface layer and the sub-surface structure of third III-V semiconductor material comprise a III-nitride material selected from the list consisting of: GaN, InN, AlGaN, InGaN, InAlN and AlInGaN.

Suitable III-nitride materials may for example have any polar crystal orientation or non-polar crystal orientation. Suitable III-nitride materials may have any crystal structure, for example a wurtzite or cubic structure, and any crystal orientation. For example, suitable III-nitride materials may include polar c-plane, non-polar a plane, or even cubic III-nitride materials.

In a particularly preferred embodiment, the surface layer consists of GaN with a charge carrier density of between $1\times10^{14}$ cm$^{-3}$ and $1\times10^{17}$ cm$^{-3}$, the quantum structure is a quantum well which consists of undoped InGaN, and the sub-surface structure consists of n-type doped GaN.

The further sub-surface structure of the third III-V material may have a charge carrier density of at least $1\times10^{17}$ cm$^{-3}$, or at least $5\times10^{17}$ cm$^{-3}$, or at least $1\times10^{18}$ cm$^{-3}$, or at least $5\times10^{18}$ cm$^{-3}$, or at least $1\times10^{19}$ cm$^{-3}$, or at least $5\times10^{19}$ cm$^{-3}$, or at least $1\times10^{20}$ cm$^{-3}$, and/or less than $1\times10^{21}$ cm$^{-3}$, or $5\times10^{21}$ cm$^{-3}$, or $1\times10^{22}$ cm$^{-3}$.

The further sub-surface structure of the third III-V material may be a sub-surface layer.

Preferably the first and/or third III-V material consists of n-type doped III-nitride material.

Particularly preferably the first and/or third III-V material is doped with silicon (Si), germanium (Ge) and/or oxygen (O).

The charge carrier density of a given layer is readily measurable by the skilled person, for example by capacitance-voltage profiling or calibrated scanning capacitance microscopy. A depth profiling Hall effect technique may also be suitable. The charge carrier density may alternatively be termed the carrier density, or the carrier concentration. References to charge carrier density herein refer to the charge carrier density at room temperature.

In a preferred embodiment, the sub-surface quantum structure consists of a planar sub-surface quantum well layer of a first III-nitride material. The surface layer and the sub-surface quantum well may form adjacent planar layers, so that an upper surface of the quantum well is in contact with a lower surface of the surface layer, or they may be separated by intervening layers of III-nitride material. Preferably the quantum well may be one of a plurality of sub-surface quantum wells formed from the same Ill-nitride material.

The surface layer, the quantum structure and the sub-surface structure may be formed by epitaxial growth. The surface layer, the quantum structure and the sub-surface structure may be formed by molecular beam epitaxy (MBE), metalorganic chemical vapour deposition (MOCVD) (also known as metalorganic vapour phase epitaxy (MOVPE)), hydride vapour phase epitaxy (HVPE), ammonothermal processes, or other conventional processes suitable for growing III-V, such as III-nitride, materials with the necessary charge carrier concentrations.

The semiconductor structure may be grown on an electrically insulating base layer, or substrate. Preferably the electrically insulating base layer may comprise sapphire, silicon, silicon carbide, $LiAlO_3$, glass or bulk GaN.

Preferably the base layer is configured to form the bottom of a multi-layer structure, the surface layer forms the top of the multi-layer structure, with the sub-surface structure arranged in between the surface layer and the base layer, and the quantum structure arranged in between the surface layer and the sub-surface structure.

Electrochemical Etching

Electrochemical etching may be carried out in a variety of acidic or basic electrolytes. For example, suitable electrolytes include Oxalic acid, KOH, NaOH, HF, HCl, and $HNO_3$.

Preferably the electrolyte should form a wetting angle, or contact angle, of 120 degrees or greater with the exposed surface of the surface layer.

In order to electrochemically etch a sample, an electrochemical cell is arranged so that the sample itself acts as an anode, and an inert electrode such as a platinum foil electrode serves as a cathode. The sample and the platinum electrode are connected to a power supply, and the sample is immersed, or partially immersed, in the electrolyte to form a circuit.

In order to apply a potential difference between the electrolyte and the sub-surface quantum structure of the sample, the sub-surface quantum structure to be porosified should be electrically connected to, or in electrical contact with, the terminal of the power supply.

Where both a quantum structure and a further sub-surface structure of the third III-V material are present, both of these structures should be electrically contacted during etching.

In order to perform electrochemical etching, the power supply is controlled to apply a potential difference (voltage) between the sub-surface quantum structure and the electrolyte, causing a current to flow through the electrolyte and the sample. The flow of current through the sample causes electrochemical etching of any sub-surface quantum structures, such that the porosity of these layers increases.

Preferably the applied potential difference between the sub-surface structure and the electrolyte is at least 2 volts (v), or 4 V, or 6 V, or 8V, or 10 V, or 15 V and/or less than 20 V, or 25 V, or 30 V in order to selectively porosify the sub-surface structure.

The potential difference may be measured as the applied voltage between a counter electrode, which is preferably a platinum electrode, and the semiconductor structure.

Electrochemical etching may be carried out in continuous or pulsed modes, and may be controlled by controlling the voltage or current across the cell.

Advantageously, the progress of the etching reaction may be monitored by measuring the etching current during the reaction.

After etching, samples can be cleaned by rinsing in deionized water and drying with $N_2$, to ensure complete dissolution of any residue etching chemicals and products, without affecting the porous structure of the sub-surface structures.

Semiconductor Structure

The semiconductor structure may comprise further sub-surface structures, or layers, in addition to the quantum structure and the sub-surface structure of the third III-V semiconductor material.

Preferably, the quantum structure is arranged beneath another sub-surface layer of a fourth III-V semiconductor material, having a charge carrier density of less than $1\times10^{17}$ $cm^{-3}$. The sub-surface layer of a fourth III-V material may be arranged between the surface layer and the quantum structure. The thickness of the sub-surface layer may be at least 40 nm, or 50 nm, or 100 nm, or 500 nm, and/or less than 1 µm, or 5 µm, or 10 µm.

As discussed above, the quantum structure should be sandwiched between semiconductor material with a larger electronic bandgap than the bandgap of the quantum structure. The quantum structure may be sandwiched between two barrier layers of III-V material, one of which is arranged above the quantum structure, and the other of which is arranged below the quantum structure.

The barrier layer above the quantum structure may be the surface layer.

Preferably, the barrier layer above the quantum structure may be a sub-surface layer of a fourth III-V semiconductor material, having a charge carrier density of less than $1\times10^{17}$ $cm^{-3}$. The thickness of the sub-surface layer may be at least 40 nm, or 50 nm, or 100 nm, or 500 nm, and/or less than 1 µm, or 5 µm, or 10 µm.

The barrier layer below the quantum structure may be the sub-surface structure of the third III-V material. Alternatively, the barrier layer below the quantum structure may be another sub-surface layer of III-V semiconductor material.

Preferably the sub-surface structure of the third III-V material is separated from the quantum structure by at least one barrier layer of III-V material.

Preferably the threading dislocation density in both the surface layer and the sub-surface structure is between $1\times10^4$ $cm^{-2}$ and $1\times10^{10}$ $cm^{-2}$. Particularly preferably the threading dislocation density in both the surface layer and the sub-surface structure is substantially equal in the surface layer and the sub-surface structure. Preferably the threading dislocation density in both the surface layer and the sub-surface structure is at least $1\times10^4$ $cm^{-2}$, $1\times10^5$ $cm^{-2}$, $1\times10^6$ $cm^{-2}$, $1\times10^7$ $cm^{-2}$, or $1\times10^8$ $cm^{-2}$ and/or equal to or less than $1\times10^9$ $cm^{-2}$ or $1\times10^{10}$ $cm^{-2}$. Typically, growers of semiconductor materials seek to minimise the threading dislocation density of the material in an effort to improve material quality. In the present invention, however, a sufficient threading dislocation density between the surface layer and the sub-surface layer may be required to allow electrochemical etching through the surface layer. This may be due to increased electrolyte or charge carrier transport to the sub-surface layer.

The surface layer is preferably a continuous layer of III-V material. That is, the surface layer is preferably substantially free from holes or large-scale defects.

In a preferred embodiment, the quantum structure and/or further sub-surface structure may also be a continuous sub-surface layer of III-V material, preferably III-nitride material.

The thickness of the surface layer is preferably at least 40 nm, or 50 nm, or 100 nm, or 500 nm, and/or less than 1 µm, or 5 µm, or 10 µm. The present invention may thus allow quantum structures to be etched under relatively thick surface layers.

In prior art relating to Sandia's photoelectrochemical etching method, GaN cap layers are applied to some samples. The cap layers in such samples typically have a thickness of 10 nm or 20 nm. The reason for such thin cap layers is likely to be that photoelectrochemical (PEC) etching requires that the illuminating light is incident on the material to be etched with sufficient energy to enable etching. This necessity for light penetration may limit the thickness of the cap layer through which PEC etching can take place, as for cap layers thicker than about 20 nm the illuminating light cannot penetrate well enough to etch a layer underneath. This greatly limits the structures which can be etched by PEC. As shown in FIG. 1, Sandia's PEC technique also damages the cap layers substantially, exposing the etched sub-layers.

The present method does not require illumination of the sub-surface quantum structure to be etched. The through-surface etching of the present invention can therefore etch a quantum structure "buried" deep in a semiconductor structure, under a relatively thick surface layer, and optionally further intermediate layers of III-V material.

Etching quantum structures under a surface layer, without etching the surface layer, is advantageous, as the etched nanostructures are encapsulated within the semiconductor structure and protected from the outside environment. Nanostructures may be sensitive to air, or to high temperatures, so encapsulation within the semiconductor structure may advantageously protect the etched nanostructures from deterioration, prolonging their lifetime.

The position of the etched nanostructures below the un-etched surface layer may also make the structures advantageously suitable for overgrowth of further semiconductor materials by protecting the nanostructures from the growth conditions for the overgrown semiconductor material. For example, overgrowth of further GaN material may require high temperatures which would destroy or damage any exposed nanostructures. By positioning the nanostructures under a surface layer, the nanostructures may advantageously be protected from these conditions.

The thickness of the further sub-surface structure, or sub-surface layer, of the third III-V material is preferably at least 1 nm, or 10 nm, or 100 nm, or 250 nm and/or less than 1 μm, or 5 μm, or 10 μm.

Particularly preferably, an outer surface of the continuous surface layer has a minimum lateral dimension of at least 300 μm, or at least 600 μm, or at least 1 mm, or at least 10 mm, or at least 5 cm, or at least 15 cm, or at least 20 cm.

Particularly preferably, the sub-surface quantum structure and/or the further sub-surface structure of the third III-V material is also a continuous layer, and has a minimum lateral dimension of at least 300 μm, or at least 600 μm, or at least 1 mm, or at least 10 mm, or at least 5 cm, or at least 15 cm, or at least 20 cm.

The minimum lateral dimension of a layer refers to the lateral width of a layer at its narrowest point. The layers used in preferred embodiments of the present invention are relatively large and thin, so the lateral dimensions of a layer should be understood to refer to the dimensions of the "top" and "bottom" surfaces of the layer, where the thickness of a layer refers to its "height", i.e. the distance between its top and bottom surfaces. Thus, where the top surface of a sample is square, the minimum lateral dimension of the sample would be the distance between opposite edges of the square. The "bottom" surface in this situation should be understood to be the surface formed first during epitaxial growth of a layer on a substrate, while the "top" surface is the surface formed on the side of the layer opposite the "bottom" surface.

The method of the present invention may advantageously be capable of porosifying quantum structures in far larger semiconductor structures than would be possible using the horizontal etching techniques of the prior art. As the method of the present invention produces electrochemical etching of sub-surface structures through a surface layer, and not horizontally in from the exposed edges of each individual layer, the effectiveness of the present invention is not limited to a maximum sample width.

With the method of the present invention it is possible to uniformly porosify a continuous sub-surface quantum well layer of an entire 2-inch semiconductor wafer, without first forming regular trenches in the wafer to expose the edges of the quantum well. This is not possible with the etching methods of the prior art, as horizontal etching could not etch into the centre of such a large wafer. Horizontal etching would be restricted to etching a distance of a few tens, or hundreds, of micrometres from the edges of the wafer.

It is further possible with the present method to uniformly porosify a continuous sub-surface quantum well layer of an entire 2-inch semiconductor wafer without protecting the surface layer with an electrically insulating layer. This is again not possible with the etching methods of the prior art, which require protection of the top surface.

The horizontal etching characteristics of the prior art have been extensively studied, and have been found to be restricted in the rate of etching in from the sample edges. Limitations such as electrolyte and charge transport may also mean that beyond a certain sample width, horizontal etching cannot reach the centre of the sample after any amount of time. Concentration of current at the sample edges for extended periods of time may also lead to uneven porosification across layers, with high porosity concentrated at the sample edges, and little porosification occurring at the sample centre.

For these reasons, the authors of the prior art have resorted to pre-preparing samples by dry-etching trenches at regular intervals across the sample, in order to allow electrolyte to access sample edges every 50 μm or so. This allows electrolyte to access the exposed edges of sub-surface layers, so that horizontal etching may occur.

The inventors of the present invention have circumvented these problems by etching through a surface layer rather than only from the edges of the layer. This method may advantageously allow porosity to develop evenly across the sub-surface layers rather than from the edges in. This may advantageously reduce the time required to etch a sample, and increase the uniformity of etching, compared to horizontal etching alone.

Particularly advantageously, as access to layer edges is not required, the method of the present invention does not require samples to be pre-prepared by creating trenches in the layers. The present invention may thus require fewer processing steps, and allow the porosification of large, continuous, semiconductor layers, without the need to break the layers up with regular trenches.

Further, as the present method does not require access to the edges of material to be etched, a variety of sub-surface quantum structures may be porosified. Unlike in the prior art, there is no need for the sub-surface structures to extend to the edge of a sample, or to present a large surface area of a side-wall for exposure to electrolyte during the etching process. Thus a variety of patterns or structures of porous material may be formed as porous sub-surface structures under the surface layer.

Preferably the method may produce pores in the sub-surface structure with an average pore size of greater than 1 nm, or 2 nm, or 10 nm, or 20 nm, and/or less than 50 nm, or 60 nm, or 70 nm. The etched nanostructures may be the semiconductor material remaining between the pores.

The pore size and morphology, and the resulting size and morphology of the sub-surface nanostructures, may advantageously be controlled by controlling the potential difference applied between the electrolyte and the sub-surface structure(s) during etching.

Preferably, the method may etch the sub-surface quantum structure such that it becomes microporous. That is, it has an average pore size of less than 2 nm. Alternatively, the method may porosify the sub-surface quantum structure such that it becomes mesoporous. That is, it has an average pore size between 2 nm and 50 nm. Alternatively, the method may porosify the sub-surface structure such that it becomes macroporous. That is, it has an average pore size of greater than 50 nm.

In a preferred embodiment, the method may be used to etch a plurality of sub-surface quantum structures.

The method may comprise the step of applying a potential difference between the sub-surface quantum structures to be porosified and the electrolyte, so that the quantum structures are electrochemically etched, while the surface layer, and any other sub-surface structure with a charge carrier density below $5\times10^{17}$ cm$^{-3}$, or less than $1\times10^{17}$ cm$^{-3}$, is not porosified.

In a particularly preferred embodiment, the sub-surface quantum structures are sub-surface quantum well layers, and the method may be used to porosify a plurality of sub-surface quantum wells. Where the semiconductor structure comprises a plurality of sub-surface quantum wells formed from III-nitride material, the method may comprise the step of: applying a potential difference between the sub-surface quantum wells to be porosified and the electrolyte, so that quantum wells are porosified by electrochemical etching, while layers with a charge carrier density below $5\times10^{17}$ cm$^{-3}$, or less than $1\times10^{17}$ cm$^{-3}$, are not porosified.

The quantum structures may be etched by trapping charge carriers from conductive sub-surface structures, even if the first III-V material of the quantum structure itself is undoped.

In a preferred embodiment, the semiconductor structure comprises a multiple quantum well (MQW) comprising a plurality of sub-surface quantum well layers arranged in a stack, and separated by intermediate barrier layers of III-V semiconductor material, in which the electronic bandgap of the sub-surface quantum wells is smaller than the bandgap of the barrier layers.

Preferably each of the sub-surface quantum wells are sequentially etched from the surface layer down.

Sub-Surface Structures

In addition to the etching of the quantum structures, further sub-surface layers, or structures, which do not form an energy minimum and are therefore not quantum structures, may be porosified by the etching process.

Layers having a charge carrier density greater than $5\times10^{17}$ cm$^{-3}$ may be porosified by electrochemical etching through the layers above.

By controlling the charge carrier density of each layer, it is possible to control which of a plurality of sub-surface layers or structures are porosified by the electrochemical etching process. Thus, a variety of multi-layer structures may be grown, in order to achieve different porosity characteristics in pre-determined layers.

If a non-quantum-well sub-surface structure, or layer, is to be porosified by electrochemical etching, its charge carrier density should be greater than $5\times10^{17}$ cm$^{-3}$. Above this threshold, the porosity of the resulting porous structure varies approximately with the charge carrier density of the initial sub-surface structure. Thus, where two sub-surface structures are provided with charge carrier densities greater than $5\times10^{17}$ cm$^{-3}$, the sub-surface structure with the higher charge carrier density will be porosified to a greater extent than the other structure, provided the same potential difference is applied to each.

In a preferred embodiment, the sub-surface structures form a plurality of sub-surface layers arranged in a stack, one above the other. The method of the present invention may advantageously etch sub-surface layers sequentially from the surface layer down. That is, the sub-surface layer nearest the surface layer may be porosified first, following which etching will proceed down through the structure to the next sub-surface layer with a charge carrier density greater than $5\times10^{17}$ cm$^{-3}$, which will then be porosified in turn, and so on.

This structure may advantageously be porosified to form a distributed Bragg reflector (DBR), which may be arranged above and/or below the quantum structure to improve light extraction.

Particularly advantageously, this sequential etching may allow a user to control the porosity of a particular sub-surface layer by controlling the potential difference between the electrolyte and the sub-surface layer during electrochemical etching of that layer. Monitoring the etching current during etching may advantageously allow the user to monitor the progress of etching sequentially through the multi-layer stack, so that the potential difference may be controlled during electrochemical etching of a particular layer.

Preferably the root mean square roughness of the surface layer is altered by less than 10%, or less than 5%, or is not altered during electrochemical etching. Particularly preferably, after etching the outermost surface of the surface layer may have a root mean square roughness of less than 10 nm, or less than 5 nm, or less than 2 nm, or less than 1 nm, or less than 0.5 nm, over an area of 1 micrometre squared, or preferably over an area of 5 micrometres squared. That is, the method of the present invention may produce an "epi-ready" surface, wherein the root mean square roughness of the surface layer is low enough to carry out further epitaxial growth on the surface layer without intermediate processing steps.

In a preferred embodiment, the surface layer and sub-surface layer(s) are provided as a wafer with a diameter of 1 inch (2.54 cm), or 2 inches (5.08 cm), or 6 inches (15.24 cm), or 8 inches (20.36 cm).

As the present method provides electrochemical etching through layers with a charge carrier density between $1\times10^{14}$ cm$^{-3}$ and $5\times10^{17}$ cm$^{-3}$, it is possible to etch a region of the sub-surface quantum structure that is far from any side-wall or edge of the semiconductor structure.

Thus, the present method may advantageously etch a region of the sub-surface quantum structure that is at least 300 μm, or 500 μm, or 750 μm, or 1 mm, or 1 cm, or 5 cm, away from the nearest side-wall, or edge, of the semiconductor structure. This would not be possible with horizontal etching, which is limited in the distance that it is possible to etch in from a layer edge, to a few tens, or at most a few hundreds of micrometres.

Particularly preferably, the method is carried out without providing trenches in the surface layer and the sub-surface quantum structure.

Preferably the surface layer is not coated with an electrically insulating layer or any other protective layer during electrochemical etching.

Preferably the semiconductor structure is not illuminated with by light having energy exceeding the electronic bandgap energy of the quantum structure material during electrochemical etching.

The semiconductor structure is preferably not illuminated by a light source with a bandwidth of less than 20 nm, or less than 10 nm, or less than 5 nm during electrochemical etching.

Optionally, the semiconductor structure is not illuminated by a light source during electrochemical etching.

The method of the present invention may be termed a "wet" etching process. The method of the present invention is not photoelectrochemical etching (PEC), as incident light plays no part in the etching process.

Preferably the potential difference applied between the first III-V semiconductor material and the electrolyte during etching is at least 2 V, or 4 V, or 6 V, or 10 V, or 15 V, and/or less than 20 V, or 25 V, or 30 V. This is far higher than the voltages involved in the PEC processes of the prior art, which actively avoid this voltage regime in order to ensure that no "dark" etching can occur.

In a particularly preferred embodiment, the semiconductor structure is an LED structure, comprising a surface layer, a layer of p-type III-nitride semiconductor material arranged between the surface layer and the quantum structure, and a layer of n-type III-nitride semiconductor material arranged beneath the quantum structure. The quantum structure is a quantum well comprising a continuous layer of undoped III-V material, and is sandwiched by two barrier layers of undoped III-V material. A sub-surface layer of third III-V material with a charge carrier density of $1\times10^{18}$ cm$^{-3}$ is arranged beneath the quantum well, spaced from the barrier layers.

This LED structure can be electrochemically etched by the method of the present invention by contacting the surface layer with electrolyte and applying a potential difference between the quantum well and the electrolyte.

When the potential difference is applied, the quantum well traps charge carriers from the conductive layer of third III-V material, and the quantum well is etched through the surface layer, the p-type layer and the barrier layer, so that the quantum well is etched evenly across the structure. The surface layer and the barrier layers have a charge carrier density of less than $1\times10^{17}$ cm$^{-3}$, and the p-type layer may be not very conductive, with a hole carrier density of approximately $2\times10^{17}$ cm$^{-3}$, which is typical of p-type doped III-nitride material such as p-GaN. Preferably, the applied potential difference is kept below about 10 V, or about 8 V. In that case the surface layer, the p-type layer and the barrier layer are sufficiently conductive to allow etching of the quantum structure to take place through these layers, but do not etch themselves. The etch therefore "bypasses" these layers, and selectively etches the quantum well layer, as it has captured charge carriers from elsewhere in the structure. The etching current can be monitored, and when the quantum well is fully etched, etching may be stopped before the layers below the quantum well are etched.

In another particularly preferred embodiment, the semiconductor structure is an LED structure, comprising a surface layer of p-type III-nitride semiconductor material with a charge carrier density of less than $5\times10^{17}$ cm$^{-3}$, arranged above the quantum structure, and a layer of n-type III-nitride semiconductor material arranged beneath the quantum structure. The quantum structure is a quantum well comprising a continuous layer of undoped III-V material, and is sandwiched by two barrier layers of undoped III-V material. A sub-surface layer of third III-V material with a charge carrier density of $1\times10^{18}$ cm$^{-3}$ is arranged beneath the quantum well, spaced from the barrier layers.

The method of the present invention may thus advantageously allow an LED structure to be etched in a single etching step, so that one or more quantum well layers may be etched to form nanostructures such as quantum dots, without affecting the rest of the structure.

This can be done even though the layers to be etched are buried in the LED structure between layers of p-type and n-type semiconductor material.

The method of the present invention may thus advantageously allow etching of a pre-formed LED structure to form nanostructures in the quantum wells of the LED structure. This etching step may advantageously have no effect on subsequent device processing steps, such as forming electrical contacts on the LED structure.

Second Aspect

According to a second aspect of the present invention, there is provided a method for forming nanostructures in a semiconductor structure. The semiconductor structure comprises a sub-surface quantum structure of a first III-V semiconductor material, beneath a surface layer of a second III-V semiconductor material having a thickness of at least 40 nm. The method comprises the steps of exposing the surface layer to an electrolyte, and applying a potential difference between the first III-V semiconductor material and the electrolyte, to electrochemically etch the sub-surface quantum structure to form a plurality of nanostructures, while the surface layer is not etched.

The surface layer may have a charge carrier density of less than $5\times10^{17}$ cm$^{-3}$, or between $1\times10^{14}$ cm$^{-3}$ and $5\times10^{17}$ cm$^{-3}$. The surface layer of the second III-V semiconductor material preferably has a charge carrier density of less than $4\times10^{17}$ cm$^{-3}$, or less than $3\times10^{17}$ cm$^{-3}$, or less than $2\times10^{17}$ cm$^{-3}$, or less than $1\times10^{17}$ cm$^{-3}$.

The thickness of the surface layer may be at least 50 nm, or 100 nm, or 500 nm, and/or less than 1 µm, or 5 µm, or 10 µm. As discussed above, such structures could not be etched by the PEC techniques of the prior art, due to the requirement that illuminating light reaches the structure to be etched with a high enough intensity to enable etching.

The semiconductor structure may further comprise a further sub-surface structure of a third III-V semiconductor material having a charge carrier density of greater than $1\times10^{17}$ cm$^{-3}$.

Further features and benefits of this method may be as described above in relation to the first aspect of the invention.

Third Aspect

According to a third aspect of the present invention, there is provided a method for etching a semiconductor structure. The semiconductor structure comprises a sub-surface quantum structure of a first III-V semiconductor material, beneath a surface layer of a second III-V semiconductor material, in which an outer surface of the surface layer has a minimum lateral dimension of at least 300 µm. The method comprises the steps of exposing the surface layer to an electrolyte, and applying a potential difference between the first III-V semiconductor material and the electrolyte, to electrochemically etch the sub-surface quantum structure to form a plurality of nanostructures, while the surface layer is not etched.

As discussed above, the "lateral" or "horizontal" etching methods of the prior art are greatly restricted in the distance that it is possible to etch into a structure. Using the techniques of the prior art it would thus not be possible to etch a semiconductor structure in which an outer surface of the surface layer has a minimum lateral dimension of at least 300 μm.

Preferably an outer surface of the surface layer has a minimum lateral dimension of at least 1 μm, or 10 μm, or 50 μm, or 100 μm, or 500 μm, or at least 1 mm, or at least 10 mm, or at least 5 cm, or at least 15 cm, or at least 20 cm.

The surface layer may have a charge carrier density of less than $5 \times 10^{17}$ cm$^{-3}$, or between $1 \times 10^{14}$ cm$^{-3}$ and $5 \times 10^{17}$ cm$^{-3}$. The surface layer of the second III-V semiconductor material preferably has a charge carrier density of less than $4 \times 10^{17}$ cm$^{-3}$, or less than $3 \times 10^{17}$ cm$^{-3}$, or less than $2 \times 10^{17}$ cm$^{-3}$, or less than $1 \times 10^{17}$ cm$^{-3}$.

The thickness of the surface layer may be at least 40 nm, or 50 nm, or 100 nm, or 500 nm, and/or less than 1 μm, or 5 μm, or 10 μm.

The semiconductor structure may further comprise a further sub-surface structure of a third III-V semiconductor material having a charge carrier density of greater than $1 \times 10^{17}$ cm$^{-3}$.

Further features of this method may be as described above in relation to the first aspect of the invention.

According to a fourth aspect of the present invention, there is provided a semiconductor structure formed by the method described above as the first aspect of the invention. The fourth aspect of the invention may also encompass semiconductor structures formed by the methods described above as the second and third aspects of the invention.

According to a fifth aspect of the present invention, there is provided a device comprising a semiconductor structure formed by the method described above as the first, second or third aspect of the invention.

Semiconductor Structure

According to a sixth aspect of the present invention, there is provided a semiconductor structure comprising a plurality of sub-surface nanostructures of a first III-V semiconductor material; and a surface layer of a second III-V semiconductor material, the surface layer having a charge carrier density of less than $5 \times 10^{17}$ cm$^{-3}$, in which the surface layer covers the sub-surface nanostructures.

Preferably the sub-surface nanostructures are quantum dots.

The surface layer may have a charge carrier density of between $1 \times 10^{14}$ cm$^{-3}$ and $5 \times 10^{17}$ cm$^{-3}$. Preferably the surface layer of the second III-V semiconductor material has a charge carrier density of less than $4 \times 10^{17}$ cm$^{-3}$, or less than $3 \times 10^{17}$ cm$^{-3}$, or less than $2 \times 10^{17}$ cm$^{-3}$, or less than $1 \times 10^{17}$ cm$^{-3}$.

As discussed above, all of the etching methods (both PEC and electrochemical etching) of the prior art proceed inwards from an exposed surface, or edge, of the layer being etched. It is therefore not possible to form such a structure, in which the "surface layer covers the sub-surface structure" with the methods of the prior art, which require that a portion of any material to be etched is exposed to the electrolyte.

The sub-surface nanostructures may form a nanostructured portion. The nanostructured portion may be a nanostructured layer. The nanostructured portion may have a thickness of 0.25 nm, corresponding to one atomic layer. The nanostructured portion preferably has a thickness less than 0.5 nm, or 1 nm, or 2 nm, or 3 nm, or 5 nm, or 10 nm, or 12 nm.

The semiconductor structure may additionally comprise a further sub-surface structure formed from a third III-V semiconductor material. The sub-surface structure of a third III-V material may be non-porous, or it may be porous. The sub-surface structure may be positioned between the surface layer and the nanostructured portion, or it may be beneath the nanostructured portion.

Preferably the surface layer completely covers the sub-surface nanostructures. The sub-surface nanostructures may be completely covered by the surface layer, such that the upper surface and all of the side-walls, or edges, of the sub-surface nanostructures are covered by the surface layer.

The semiconductor structure may be a multi-layer semiconductor structure.

It would not be possible to form a semiconductor device in which the surface layer completely covers the sub-surface nanostructures using the etching methods of the prior art, which require that the electrolyte contacts the material to be etched.

The semiconductor structure may be formed on an insulating base layer, for example a sapphire substrate, so that the "bottom", or lower, surface of the sub-surface structure (i.e. the surface facing away from the surface layer) will abut either the base layer, or a further sub-surface structure. Thus, the bottom surface of the sub-surface structure is not exposed to its surroundings.

If no portion of the sub-surface structure is exposed, it would not be possible to form such a semiconductor structure using the etching methods of the prior art, which require that a portion of any material to be etched is exposed to the electrolyte.

Preferably, the upper surface of the surface layer has a minimum lateral dimension of at least 1 μm, or 10 μm, or 50 μm, or 100 μm, or 500 μm, or at least 1 mm, or at least 10 mm, or at least 5 cm, or at least 15 cm, or at least 20 cm.

As the sub-surface nanostructures are covered by the surface layer, the lateral width of the nanostructured portion, or layer, formed by the sub-surface nanostructures will be less than the lateral width of the surface layer. As the surface layer may be very thin, however, there may only be a difference of a few nanometres or micrometres. Preferably, the nanostructured portion is a uniform sub-surface layer.

Particularly preferably the nanostructured portion has a minimum lateral dimension of at least 500 nm, 1 μm, 5 μm, 45 μm, 95 μm, or 1 mm, or at least 10 mm, or 5 cm, or 15 cm, or 20 cm.

In an exemplary preferred embodiment, a 20 μm×20 μm×20 μm "cube" semiconductor structure comprises a 3 nm-thick layer of nanostructured InGaN, covered by a surface layer of GaN having a charge carrier density of between $1 \times 10^{14}$ cm$^{-3}$ and $1 \times 10^{17}$ cm$^{-3}$. The bottom surface of the cube is in contact with a sapphire substrate, while the other five faces of the cube are covered by the GaN surface layer.

Such a structure may be formed by the method of the present invention, by etching a 20 μm×20 μm×20 μm cube containing a 3 nm-thick, 18 μm×18 μm wide InGaN quantum well layer, sandwiched between GaN barrier layers with a charge carrier density of between $1 \times 10^{14}$ cm$^{-3}$ and $1 \times 10^{17}$ cm$^{-3}$. A 5 μm-thick layer of n-type GaN with a charge carrier density of approximately $1 \times 10^{19}$ cm$^{-3}$ is positioned below the quantum well and the lower GaN barrier layer. The structure is completely covered in a 1 μm-thick GaN surface layer with a charge carrier density of between $1 \times 10^{14}$ cm$^{-3}$ and $1 \times 10^{17}$ cm$^{-3}$. The method of the present invention allows electrochemical etching to proceed through a surface layer of III-V material, in order to porosify the quantum well inside the cube so that it forms a 3 nm-thick layer of nanostructured porous InGaN. This would not be possible using the horizontal etching methods of the prior art, as these methods require that the layer to be porosified is exposed to electrolyte during etching.

Preferably both the surface layer and the sub-surface nanostructured portion have a minimum lateral dimension of more than 550 µm.

As discussed above in relation to the first aspect of the invention, the horizontal/lateral etching methods of the prior art are not capable of porosifying a sub-surface layer with a minimum lateral dimension of more than a few hundred micrometres. In structures that are pre-patterned with vertical trenches cut into the layers, the minimum lateral dimension of the sample may be the distance between adjacent trenches.

Furthermore, horizontal etching methods may not create a porous sub-surface layer that has uniform porosity throughout the layer. Particularly where the minimum lateral dimension of the sub-surface layer is relatively large, for example 250 µm, limitations in electrolyte and/or charge transport into the layer from its edges may create uneven porosity throughout the sub-surface layer. Such horizontal etching methods are likely to create regions of high porosity at and near to the exposed edges of the sub-surface layer, where the sub-surface layer is exposed to the electrolyte, with decreasing porosity further away from the layer edge. This effect may be particularly prevalent in larger structures, where problems with electrolyte and/or charge transport become more pronounced further away from the edges.

Preferably the surface layer and the nanostructures comprise III-nitride materials selected from the list consisting of: GaN, InN, AlGaN, InGaN, InAlN and AlInGaN. The surface layer and the porous sub-surface structure may be formed from the same III-nitride material, or they may be formed of different III-nitride materials.

In a particularly preferred embodiment, the surface layer consists of GaN with a charge carrier density of between $1\times10^{14}$ cm$^{-3}$ and $1\times10^{17}$ cm$^{-3}$, and the porous sub-surface structure is a 3 nm-thick layer consisting of nanostructured porous InGaN.

The semiconductor may comprise a plurality of sub-surface layers of nanostructures in the form of a stack of layers; in which sub-surface layers of nanostructures are separated by intermediate barrier layers of non-porous III-V semiconductor material. Such a structure may be a multiple quantum well (MQW) structure.

Preferably the threading dislocation density in both the surface layer and the sub-surface quantum structure is between $1\times10^{4}$ cm$^{-2}$ and $1\times10^{10}$ cm$^{-2}$. Particularly preferably the threading dislocation density in both the surface layer and the sub-surface quantum structure is at least $1\times10^{4}$ cm$^{-2}$, $1\times10^{5}$ cm$^{-2}$, $1\times10^{6}$ cm$^{-2}$, $1\times10^{7}$ cm$^{-2}$, or $1\times10^{8}$ cm$^{-2}$ and/or less than $1\times10^{9}$ cm$^{-2}$ or $1\times10^{10}$ cm$^{-2}$.

The thickness of the surface layer is preferably at least 40 nm, or 50 nm, or 100 nm, and/or less than 1 µm, or 5 µm, or 10 µm. As discussed above, the PEC methods of the prior art would be unable to laterally etch nanostructures under such a thick surface "cap" layer, as PEC requires light penetration to the structure being etched.

The surface layer is preferably a continuous layer of a second III-V material, particularly preferably a second III-nitride material.

In addition to the nanostructures, the semiconductor structure may comprise a distributed Bragg reflector formed from a plurality of stacked sub-surface layers of III-nitride material, in which odd sub-surface layers are porous, with uniform porosity throughout the layer, and even sub-surface layers are non-porous.

In a particularly preferred embodiment, the semiconductor structure may comprise a DBR arranged above, and a DBR arranged below, a layer of nanostructures. Such an arrangement may increase the light extraction from the semiconductor structure.

Particularly preferably the semiconductor structure is not patterned with trenches. In other words, the surface layer and sub-surface nanostructured portion may be continuous, or uninterrupted, across their entire width.

Preferably the upper, top, or outermost surface of the surface layer has a root mean square roughness of less than 10 nm, or less than 5 nm, or less than 2 nm, or less than 1 nm, or less than 0.5 nm, over an area of 1 micrometre squared. On c-plane GaN, for example, the root mean square roughness may be less than 1 nm over an area of 1 µm×1 µm. Root mean square roughness may be measured with an atomic force microscope.

Low root mean square roughness is desirable in order to allow epitaxial overgrowth directly onto the semiconductor structure.

Preferably further III-nitride epitaxial layers and device structures may be deposited directly onto the semiconductor structure, after cleaning, by techniques such as MBE, MOCVD, or HVPE. Following this overgrowth, high performance optical and electrical devices may be fabricated on the structures. Suitable devices may include, for example, light-emitting diodes (LED), laser diodes (LD), high electron mobility transistors (HEMT), solar cells, and semiconductor-based sensor devices.

Preferably the top, outermost, or upper, surface of the surface layer is not coated with an electrically insulating layer. In other words, the top surface of the surface layer may be exposed.

According to a seventh aspect of the invention there is provided a use of a semiconductor structure as a substrate for overgrowth of one or more semiconductor devices. The semiconductor structure may be as described in relation to the sixth aspect of the invention, above.

According to an eighth aspect of the invention there is provided a device incorporating or mounted on a semiconductor structure. The semiconductor structure may be as described in relation to the sixth aspect of the invention, above.

According to an ninth aspect of the invention there is provided a method for making an LED. The method may advantageously incorporate the method of etching a semiconductor structure according to the first aspect of the invention.

BRIEF DESCRIPTION OF THE DRAWINGS

Specific embodiments of the invention will now be described with reference to the figures, in which.

DETAILED DESCRIPTION

Figure 1:
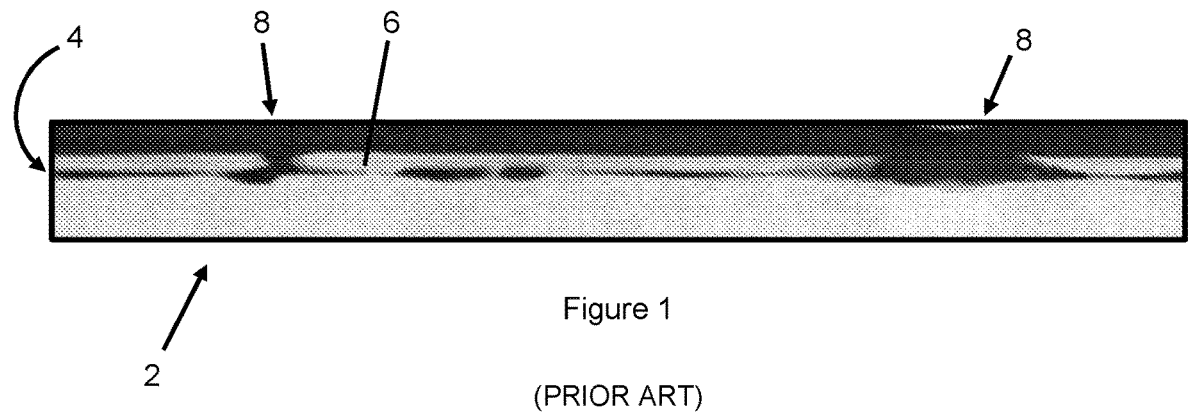
FIG. 1 shows a scanning TEM micrograph taken from Wang et al (slides), *Sandia National Laboratories;*

FIG. 1 shows a scanning TEM micrograph taken from Wang et al (slides), *Sandia National Laboratories*, showing an etched sample 2. The sample 2 comprises an InGaN quantum well 4 formed as a layer beneath a GaN "cap" layer 6. The sample 2 has been etched using Sandia's "quantum-size-controlled-photoelectrochemical (QSC-PEC)" etching technique. As can be clearly seen in the Figure, the QSC-PEC etching process has damaged the GaN cap layer, creating holes 8 through the entire thickness of the cap layer, so that the etched quantum well layer 4 is exposed. This seems to be the result of undesirable "vertical" etching discussed in publications relating to Sandia's technique.

The damage Sandia's QSC-PEC technique causes to the GaN cap layer is highly undesirable, as etched quantum structures may be relatively unstable in air. Having the etched layer exposed to the outside environment through holes in the cap layer may therefore cause the etched layer to deteriorate. A further disadvantage of this damage to the cap layer is that it may make overgrowth of further semiconductor material difficult or impossible. Any material that is overgrown on such a broken surface layer would be of poor quality, and may not be suitable for a range of applications.

Figure 2:
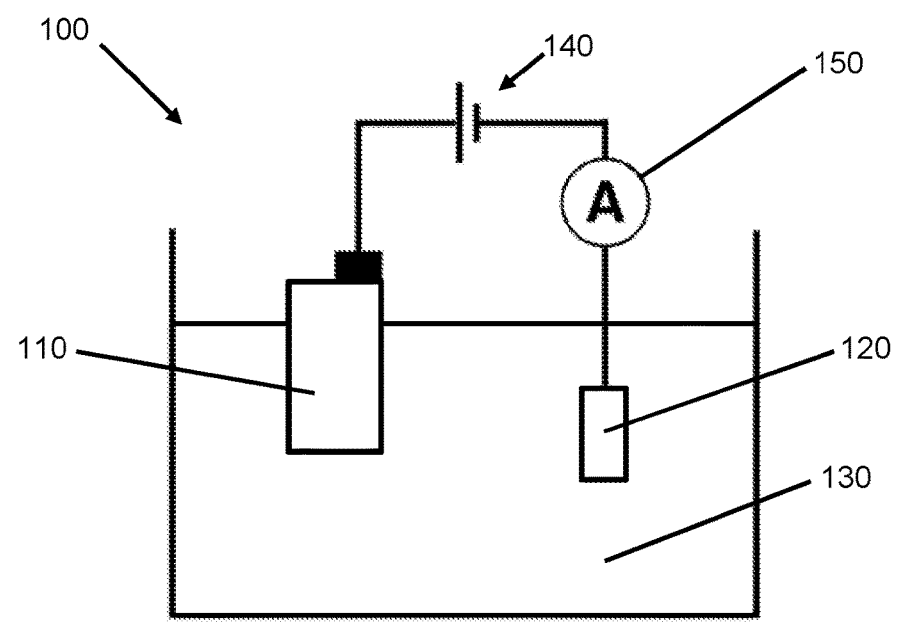
FIG. 2 shows a schematic illustration of the experimental setup for electrochemical etching.

FIG. 2 shows a schematic of an electrochemical (EC) experimental setup usable in the method of the present invention. As shown in FIG. 2, the experimental setup consists of a two-electrode electrochemical cell 100, with a sample 110 connected as an anode and a platinum foil 120 connected as a cathode. The platinum cathode, and at least a portion of the surface layer of the sample, are exposed to an electrolyte 130 by immersion in the electrolyte. A constant current DC power supply 140 is connected between the anode and the cathode, and an ammeter 150 is used to monitor and record the etching current flowing through the circuit.

Unless otherwise stated, the EC etching experiments described herein were conducted at room temperature with a semiconductor structure as the anode and a platinum foil as the counter electrode (cathode). Oxalic acid with a concentration of 0.25 M was used as the electrolyte. The etching process was carried out in a constant voltage mode controlled by a Keithley 2400 source meter. After etching, samples were rinsed with deionized water and blow dried in N2.

As discussed above in the summary of invention, the skilled person will appreciate that the term "undoped" is relatively imprecise in semiconductor technology. Practically speaking, all semiconductor material contains inherent impurities which can be thought of as "dopant" atoms. Different methods of semiconductor growth may produce different levels of impurity, and thus different inherent charge carrier concentrations.

Thus, it is possible that semiconductor materials referred to in the prior art as "undoped" may have high impurity levels, such that they have a natural charge carrier density of above $1 \times 10^{17}$ cm$^{-3}$ arising from impurities alone.

In appreciation of this, the inventors of the present invention prefer to use the term "non-intentionally-doped" (NID) to refer to semiconductor material that has been made without intentional doping. The impurity levels of semiconductor materials naturally depend on factors including the method by which they are formed, the environment in which they are formed, and the purity of the reactants used to form the semiconductor materials.

In the present application, the term "non-intentionally-doped" (NID) should be understood to refer to semiconductor materials deliberately grown to be as pure as possible, which have been measured to have a charge carrier density of between $1 \times 10^{14}$ cm$^{-3}$ and $1 \times 10^{17}$ cm$^{-3}$.

Semiconductor materials which have been intentionally doped with n-type dopants to obtain a charge carrier density greater than $5 \times 10^{17}$ cm$^{-3}$, may be referred to as "n" or "n+" semiconductor material. In the description below, "n" designates lightly-doped n-type material with a charge carrier density of approximately $1 \times 10^{18}$ cm$^{-3}$, while "n+" designates n-type doped material with a charge carrier density greater than or equal to approximately $1 \times 10^{19}$ cm$^{-3}$.

Figure 3A:
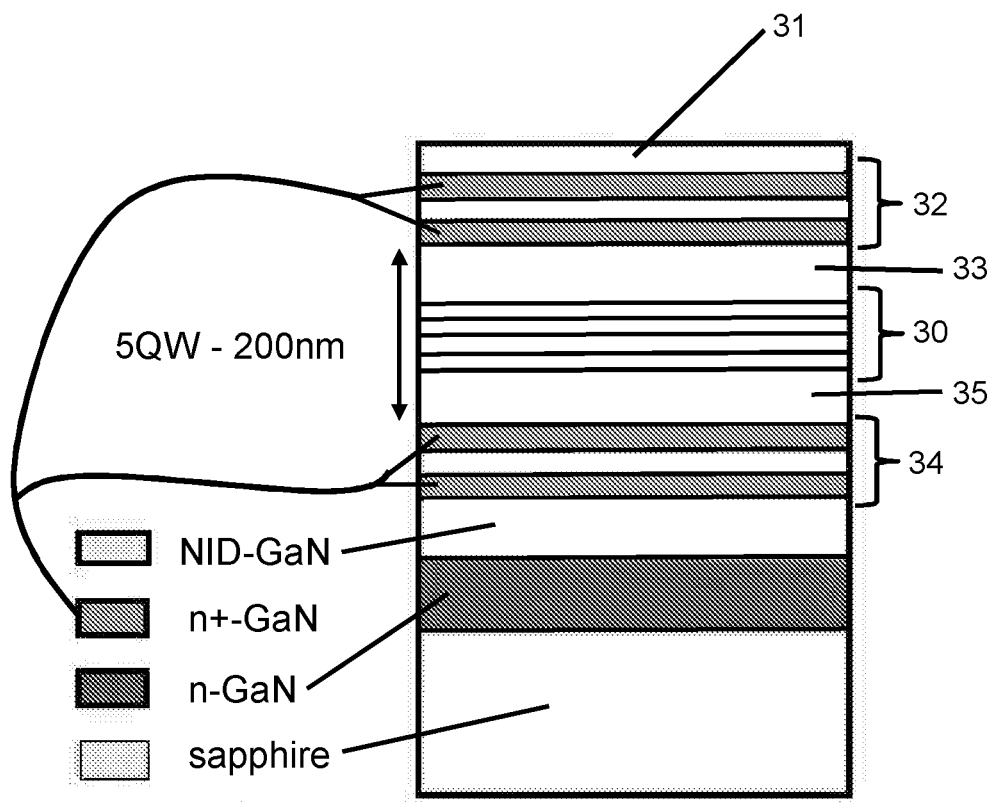
FIG. 3A shows a schematic illustration of a multi-layer semiconductor structure according to an aspect of the present invention.

FIG. 3A shows a schematic diagram of an epitaxial non-polar sample structure, which comprises five InGaN quantum wells 30 positioned between two distributed Bragg reflectors (DBRs).

Each of the two DBRs is a "two-pair" DBR consisting of four alternating layers of non-intentionally-doped GaN (NID-GaN) and heavily doped n-type GaN (n+-GaN) layers. The NID-GaN layers have a charge carrier density of less than $1 \times 10^{17}$ cm$^{-3}$, while the n+-GaN layers have a nominal silicon doping concentration of $2.3 \times 10^{19}$ cm$^{-3}$. Each of the alternating NID-GaN/n+-GaN layers has a thickness of approximately 71 nm and 53 nm, respectively.

The sample comprises an uppermost surface layer 31 of NID-GaN. A first two-pair DBR 32 is positioned beneath the surface layer and above a 100 nm-thick layer of NID-GaN 33 which covers the uppermost of five InGaN quantum wells 30. Each quantum well 30 is a layer of NID-InGaN with a thickness of 3 nm, sandwiched between barrier layers of NID-GaN with a thickness of 7 nm. A second 100 nm-thick layer of NID-GaN 35 is positioned between the bottom-most of the five InGaN quantum wells 30 and a second two-pair DBR 34. Below the second two-pair DBR there is a layer of lightly doped n-type GaN (n-GaN). The n-GaN layer has a charge carrier density of approximately $1\times10^{18}$ cm$^{-3}$. The n-GaN layer has a thickness of 2 μm and is present for uniform distribution of the anodization bias across the sample. The n+GaN layer in the DBR stack and the n-GaN layer may function to donate charge carriers to the NID-quantum wells to allow etching of the quantum wells. Below the n-GaN layer there is a base layer of NID-GaN arranged on a sapphire substrate.

The sample was grown by metal-organic vapour phase epitaxy (MOVPE) in a 6×2 in. Thomas Swan close-coupled showerhead reactor on r-plane sapphire substrates using trimethylgallium and ammonia as precursors, hydrogen as a carrier gas and silane for n-type doping. Firstly, a 4 μm thick c-plane GaN pseudosubstrate (not shown) was grown with a nominal dislocation density of ~$4\times10^8$ cm$^{-2}$. After the growth of another 500 nm undoped GaN layer (not shown), the rest of the layered structure was epitaxially grown on the pseudosubstrate.

The sample of FIG. 3A was electrically contacted by soldering an indium wire to the edge of the sample, so that the indium wire contacts the edges of the quantum wells, the n-GaN layer, and the n+-GaN layers to be etched. A portion of the sample, of approximately 1 cm×1 cm in size, was then immersed in the electrolyte. Using the experimental setup shown in FIG. 2, an EC etching process was carried out on the sample in a constant voltage mode, with a DC bias of 6 V, and controlled by monitoring and recording the etching current signal at room temperature. The sample was not illuminated with narrowband light.

The EC porosification process begins from the top down, with the oxidation of the alternating n+-GaN layers of the upper DBR 32 by localised injection of holes upon the application of a positive anodic bias, and localised dissolution of such oxide layer in the acid-based electrolyte will result in the formation of a mesoporous structure.

The porosification of the alternating n+-GaN layers, but not the NID-layers, creates a contrast in refractive index between alternating layers, such that the etched structure acts as a DBR.

Once all of the n+-GaN layers in the upper DBR 32 have been etched and transformed into mesoporous GaN layers, the EC porosification proceeds down the structure to etch the InGaN quantum wells. Although the quantum wells themselves are not doped, and therefore have a low inherent charge carrier density, the quantum wells act as an energy minimum which traps charge carriers from other parts of the semiconductor structure. In the structure of FIG. 3A, the quantum wells may capture charge carriers from the n+-GaN layers of the lower DBR 34, or from the underlayer of n-GaN.

The quantum wells are therefore sequentially etched from the uppermost quantum well downwards. During etching, pores form throughout the quantum well layers, and InGaN material is removed from the layer. What remains consists of a network of connected nanostructures of InGaN. Due to the removal of InGaN material, the nanostructures are very small, with their maximum dimensions typically on the order of a few nanometres, which is on the order of the de Broglie wavelength for the charge carriers in the InGaN.

This reduction in size means that charge carriers within the InGaN nanostructures experience quantum confinement in all three dimensions.

The barrier layers of NID-GaN separating the quantum wells are not etched, as they are not sufficiently conductive to etch, and they are not energy minima capable of trapping charge carriers from elsewhere.

After the five quantum wells have been etched into nanostructures, the etching proceeds downwards to porosify the n+-GaN layers of the lower DBR 34.

The end of the anodisation process is reached when the etching current drops to the base line level, indicating that all the n+-GaN layers, and the quantum wells, have been etched. This may typically be after approximately 30 minutes for a semiconductor structure of this size.

Figure 3B:
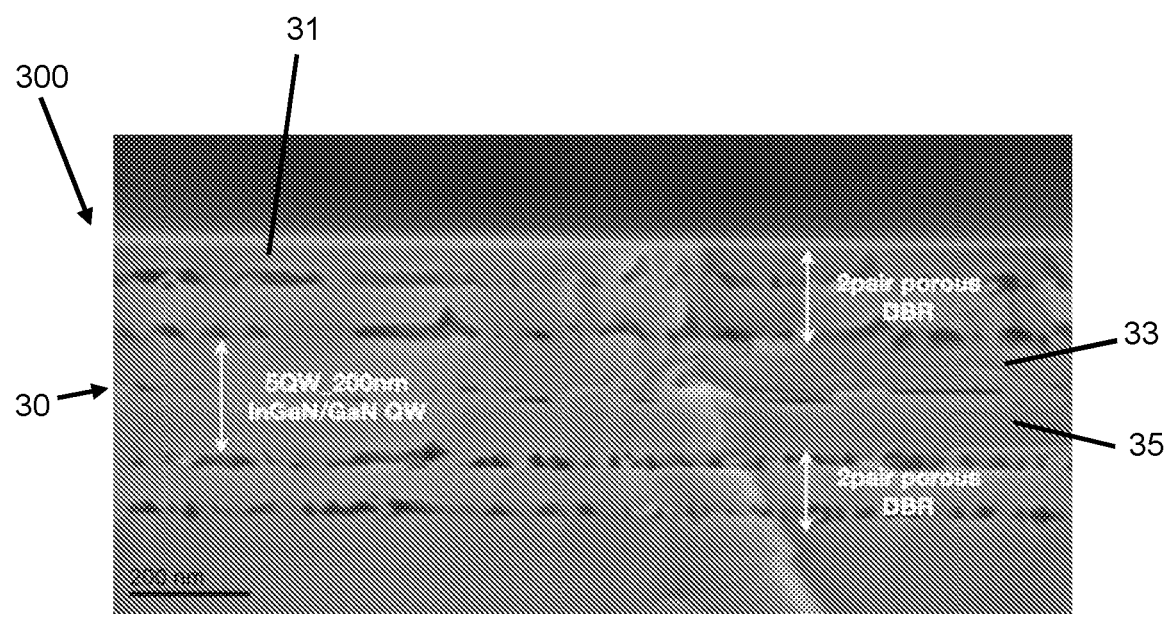
FIG. 3B shows a cross-sectional scanning electron microscopy (SEM) image of the multi-layer semiconductor structure of FIG. 3A, after etching.

The cross-sectional scanning electron microscopy (SEM) image in FIG. 3B shows the morphology of the etched structure 300. The cross-section of FIG. 3B was taken from an edge cleaved post-etching, far away from the original sample edges. This confirms that the porosification process proceeded extremely uniformly across the entire sample area that was immersed in the etching solution. FIG. 3B further shows that the NID-GaN layers stay almost intact during the EC etching, and are not themselves porosified. Only the n+-GaN layers and the quantum well layers are selectively etched and transformed into porous layers.

The 1 cm×1 cm sample is far larger than samples porosified by horizontal etching in the prior art, as horizontal etching would be unable to penetrate horizontally into the centre of such a large sample without regular trenches in the sample surface. Furthermore, the etching time of 30 minutes would be insufficient for horizontal etching to proceed far into the bulk material of the sample. Thus the porous cross-section of FIG. 3B, taken far from the sample edges, is evidence that the quantum wells, and the n+-GaN layers, have been etched through the surface layer of NID-GaN, and not horizontally from the sample edges.

Figure 3C:
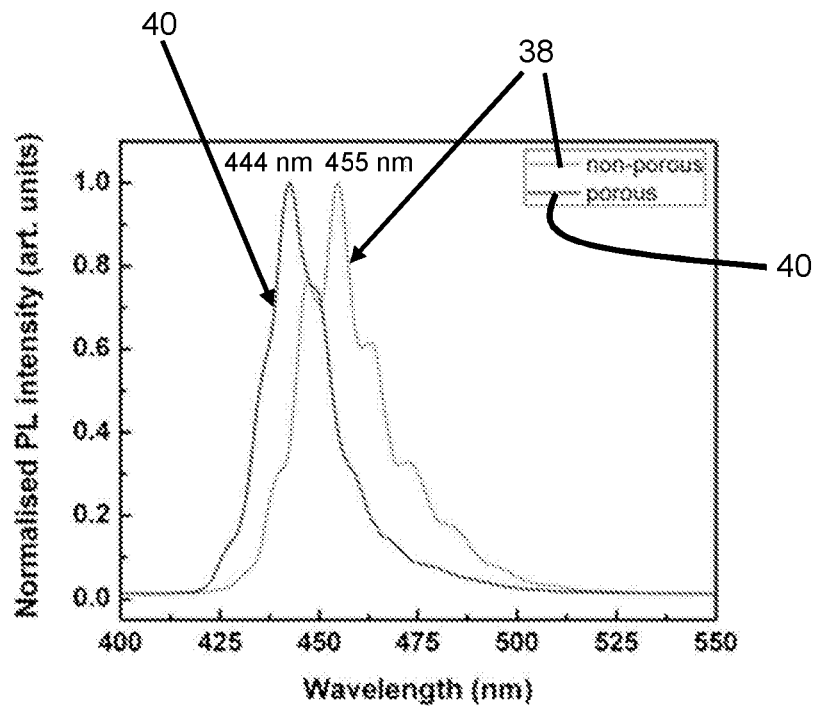
FIG. 3C shows the measured photoluminescence (PL) spectra of the semiconductor structure of FIG. 3A, before and after etching.

The semiconductor structure of FIGS. 3A and 3B exhibits photoluminescence both before and after etching. FIG. 3C shows the measured photoluminescence (PL) spectra of the semiconductor structure of FIG. 3A, before and after etching.

The pre-etching spectrum 38 demonstrates the PL behaviour of the non-porous multiple-quantum-well (MQW) structure.

The post-etching spectrum 40 demonstrates the PL behaviour of the five nanostructured layers. The intensity of the spectra have been normalised to negate the effect of the DBRs in the etched structure.

Comparing the PL spectra before and after etching shows that the etching of the quantum wells into nanostructured layers leads to an 11 nm-shift in the PL spectrum of the semiconductor structure towards shorter wavelengths. This is referred to as a "blue-shift".

This "blue-shift" of the photoluminescence spectrum may be the result of the increased quantum confinement experienced by charge carriers in the nanostructured layers compared to the 2-D quantum well. Etching to form nanostructures may also cause strain relaxation in the nanostructured layer, which may advantageously increase the electron-hole overlap and reduce the electron-hole recombination time. The same decrease in internal electric field which increases the electron-hole overlap may also cause a blue shift.

This blue shift may be particularly advantageous for the manufacture of short-wavelength light sources, for example UV-LEDs.

Figure 4:
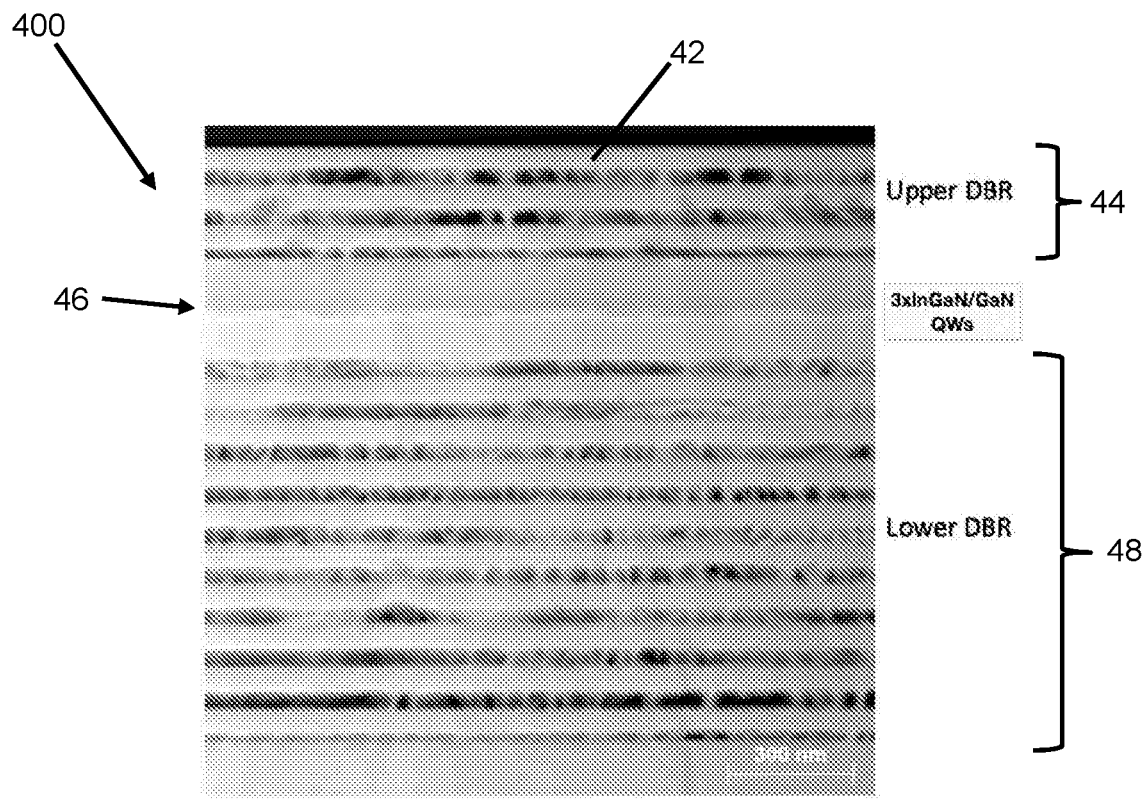
FIG. 4 shows a cross-sectional transmission electron microscopy (TEM) image of an etched multi-layer semiconductor structure according to a preferred embodiment of the present invention.

FIG. 4 shows a cross-sectional transmission electron microscopy (TEM) image of an etched multi-layer semiconductor structure 400 according to a preferred embodiment of the present invention. The semiconductor structure of FIG. 4 has a NID-GaN surface layer 42 above an etched upper DBR 44. Three 3 nm-thick NID-InGaN nanostructured layers 46, separated by 7 nm-thick barrier layers of NID-GaN, are positioned one-above-another beneath the upper DBR 44 and above an etched lower DBR 48. The lower DBR 48 is formed from a greater number of porous/non-porous layers than the upper DBR 44, which may advantageously improve light extraction out of the upper surface 42 of the structure 400.

The etched semiconductor structure 400 of FIG. 4 is formed by the etching method described above in relation to FIG. 3A. Prior to etching, the nanostructured layers 46 were 3 nm-thick quantum wells of NID-InGaN, and the upper and lower DBRs were alternating layers of non-porous NID-GaN and n+-GaN.

The etching method of the present invention thus advantageously allows the n+-GaN layers of the DBRs to be porosified in the same step as etching nanostructures in the quantum well layers.

Figure 5:
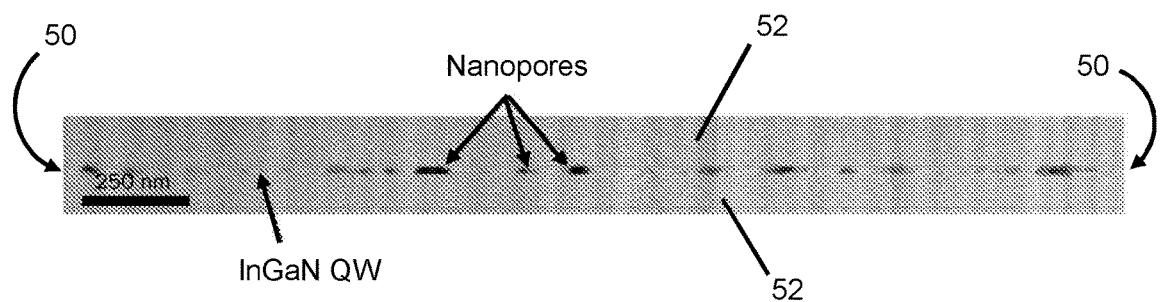
FIG. 5 shows a cross-sectional transmission electron microscopy (TEM) image of a nanostructured layer formed by etching a quantum well according to the present invention.

FIG. 5 shows a cross-sectional transmission electron microscopy (TEM) image of a single nanostructured layer 50 of NID-InGaN sandwiched between barrier layers 52 of NID-GaN. The nanostructured layer 50 has been formed by etching an NID-InGaN quantum well according to the method of the present invention, as described above.

FIG. 5 shows a plurality of nanopores distributed through the nanostructured layer 50. The pores are well-defined, and have been created selectively in the quantum well layer during etching. No pores have been created in the NID-GaN barrier layers.

As discussed above, the creation of pores in the quantum well layer creates nanostructures which exhibit quantum confinement in three dimensions, rather than the one-dimensional confinement exhibited by the un-etched quantum well. This can provide advantages including improving the recombination efficiency of light emission from the quantum layer, and results in a blue-shift of the emission spectrum.

As with the samples shown in cross-section in other Figures, the cross-section TEM image of FIG. 5 was taken distant from any edge of the sample. Given the timescale of the etching process, the nanostructures could not have been created by the "lateral" etching pathways of the prior art. There is also no damage to the layers above the nanostructured layer 50, as exhibited by the unwanted "vertical" etching pathways in other prior art techniques. The nanostructured layer 50 seen in FIG. 5 can thus only have been created by the through-surface etching discussed above.

Figure 6A:
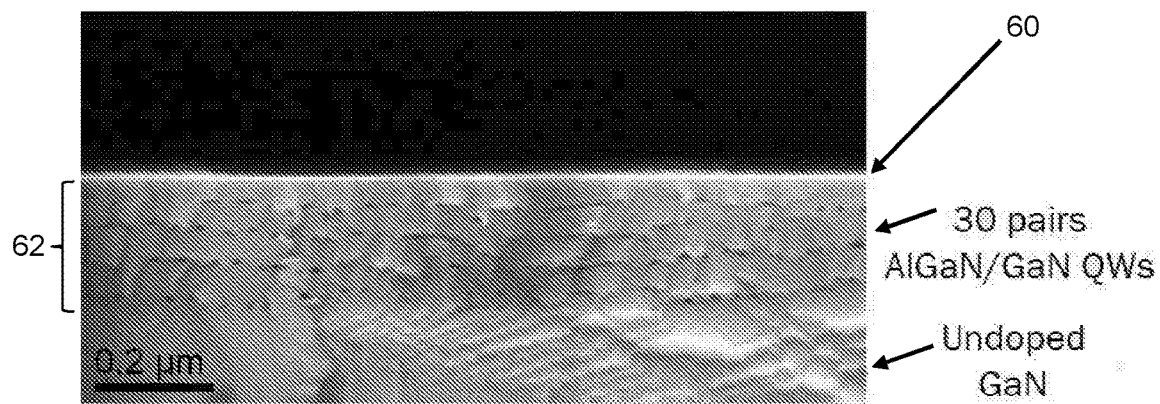
FIG. 6A shows a cross-sectional scanning electron microscopy (SEM) image of an etched multi-layer semiconductor structure according to a preferred embodiment of the present invention.

FIG. 6A shows a cross-sectional transmission electron microscopy (TEM) image of an etched multi-layer semiconductor structure according to another preferred embodiment of the present invention.

The semiconductor structure shown in FIG. 6A was formed by etching a stack of 30 NID-GaN quantum wells (2 nm-thick), separated by barrier layers of NID-AlGaN (5 nm thick). The quantum wells are positioned beneath a surface layer 60 of NID-GaN and above a 500 nm-thick layer of NID-GaN. A further sub-surface layer of n-GaN (not shown) is positioned underneath the NID-GaN, in order to donate charge carriers to the quantum wells and to spread current during etching.

Similarly to the InGaN quantum well embodiments described above, and using the same etching technique, the GaN quantum wells have been etched to form 30 nanostructured layers 62 of NID-GaN buried in the semiconductor structure.

Figure 6B:
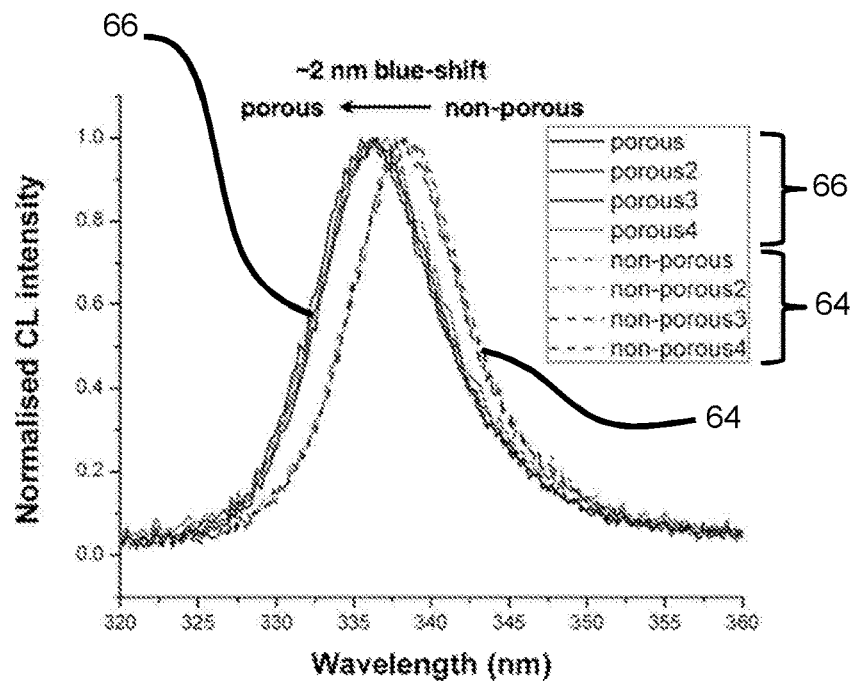
FIG. 6B shows the measured cathodoluminescence (CL) spectra of the semiconductor structure of FIG. 6A, before and after etching.

FIG. 6B shows the measured cathodoluminescence (CL) spectra of the semiconductor structure of FIG. 6A, before and after etching. Results from four positions from each sample are shown in FIG. 6B.

The pre-etching spectra 64 demonstrate the CL behaviour of the non-porous multiple-quantum-well (MQW) GaN/AlGaN structures.

The post-etching spectra 66 demonstrate the CL behaviour of the 30 nanostructured layers.

Comparing the CL spectra before and after etching shows that the etching of the GaN quantum wells into nanostructured layers leads to a 2 nm-shift in the CL spectrum of the semiconductor structure towards shorter wavelengths. This is referred to as a "blue-shift".

As the blue shift exhibited by etching GaN quantum wells pushes the emission spectrum even further into the UV, this may be highly advantageous in the manufacture of UV-LEDs.

Figure 7:
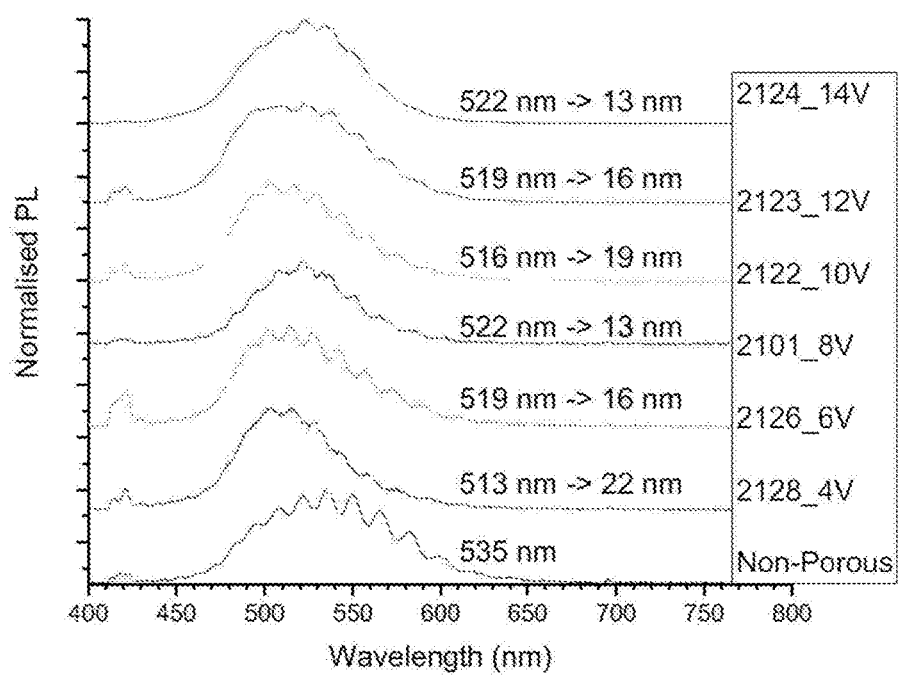
FIG. 7 shows the measured photoluminescence (PL) spectra of a seven identical semiconductor structures etched at different voltages according to the present invention.

FIG. 7 shows the measured photoluminescence (PL) spectra of a range of semiconductor structures etched at different voltages according to the present invention. Seven identical semiconductor structures were formed with the same sample structure described above in relation to FIGS. 3A and 3B. The samples comprise five InGaN quantum wells between upper and lower two-pair DBRs.

Six of the structures were then etched for 30 minutes at different etching voltages of 4V, 6V, 8V, 10V, 12V and 14V, respectively, so that the quantum well layers in the structures were etched to form layers of nanostructures.

The PL spectra of the six etched samples, and the one un-etched sample, were then measured, the results of which are shown in FIG. 7. As can be seen in FIG. 7, all of the etched samples exhibited a blue shift in emission spectrum compared to the un-etched, non-porous, sample. The greatest blue shift, of 22 nm, was exhibited by the sample etched at 4 V, with blue shifts gradually decreasing with a higher etching voltage.

Figure 8A:
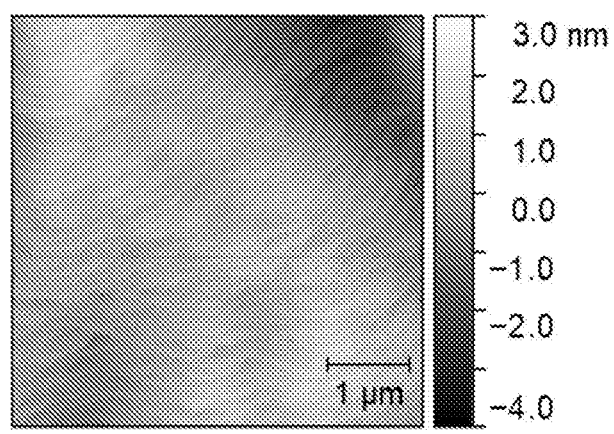
FIG. 8A shows an AFM image of the top surface of an unetched semiconductor structure.
Figure 8B:
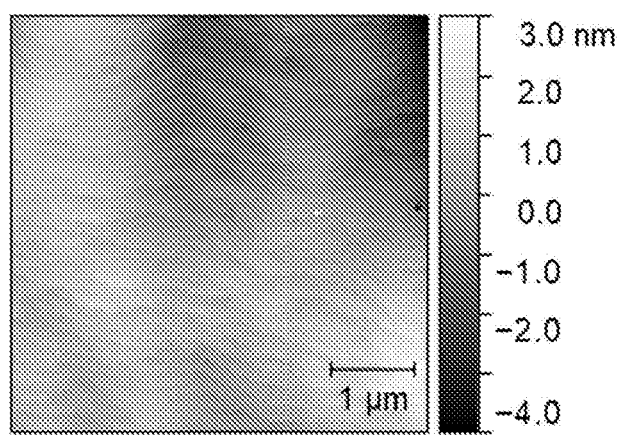
FIG. 8B shows an AFM image of the top surface of the structure of FIG. 8A, after etching at 6 V according to the present invention.

FIG. 8A shows an AFM image of the top surface of an unetched semiconductor structure;

FIG. 8B shows an AFM image of the top surface of the structure of FIG. 8A, after etching at 6V according to the present invention;

To evaluate possible etching damage of a top surface layer of NID-GaN, atomic force microscopy (AFM) images were taken of a surface layer before and after etching. These AFM images are shown in FIGS. 8A and 8B, respectively. Apart from some dirt/small particles present in the porous region that may be related to the EC etching products, contaminants in the etching chemicals and/or sample cleaning, no changes to the surface morphology were observed and the root mean square roughness ($R_R$ms) of the top GaN surface is similar in both the etched and unetched samples, at around 1 nm measured over a 5 μm×5 μm area. The root mean square roughness ($R_{RMS}$) of the top GaN surface is similar in the unetched sample was measured by AFM to be 0.9972 nm over a 5 μm×5 μm area, while the root mean square roughness ($R_{RMS}$) of the top GaN surface is similar in the etched sample was measured by AFM to be 1.095 nm over a 5 μm×5 μm area It appears therefore that the sub-surface EC porosification does not degrade the surface of the GaN surface layer, and the $R_{Rms}$ of the post-etching sample is sufficiently low for further semiconductor overgrowth.

Figure 9A:
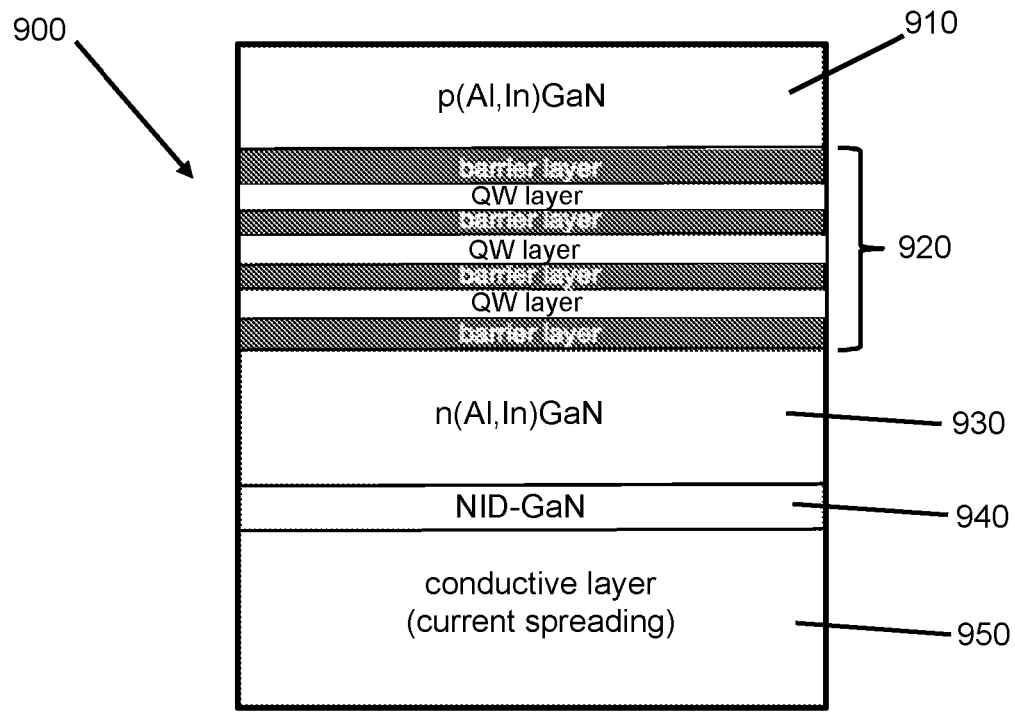
FIG. 9A shows a schematic illustration of an LED structure to be etched according to an aspect of the present invention.

FIG. 9A shows a schematic illustration of an LED structure 900 to be etched according to an aspect of the present invention.

While alternative LED structures comprising p-type and n-type AlGaN or InGaN (indicated by brackets on FIG. 9A) could be etched by the method of the present invention, the structure 900 will be described below with layers of p-type GaN and n-type GaN.

The LED structure 900 comprises a 350 nm-thick layer of p-type GaN semiconductor material 910, with a charge carrier density of approximately $2\times10^{17}$ cm$^{-3}$. This p-type GaN layer forms the surface layer of the structure. Five 3 nm-thick NID-InGaN quantum wells 920 are formed as a stack of continuous layers separated by 7 nm-thick NID-GaN barrier layers. A 500 nm-thick layer 930 of n+-GaN, with a charge carrier density of approximately $5\times10^{18}$ cm$^{-3}$, is arranged beneath the quantum well stack. A sub-surface layer 940 of 250 nm thick NID-GaN is arranged beneath the n+-GaN and above a 500 nm-thick layer 950 of n-GaN with a charge carrier density of $1\times10^{18}$ cm$^{-3}$.

The sub-surface layers of n-type GaN may advantageously act as "conductive", or "current spreading" layers during etching. Charge carriers from the n-type GaN may be trapped by the quantum wells to increase their charge carrier density so that the NID-InGaN quantum wells are etched to form nanostructures.

Instead of layers of p-type GaN, n+-GaN, and n-GaN, alternative III-nitride materials with appropriate charge carrier densities may be used. The quantum wells may also be formed from materials, preferably III-nitride materials, other than InGaN. Further layers of III-V material, preferably III-nitride material, may also be present in the structure.

The LED structure of FIG. 9A can be electrochemically etched by the method described above, by contacting the surface layer with electrolyte and applying a potential difference of 8 V between the quantum wells and the electrolyte. A potential difference of 8 V is also applied between the conductive n-GaN layer and the electrolyte.

The surface layer, the p-type layer and the barrier layers are sufficiently conductive to allow etching of the quantum wells to take place through these layers, but these layers do not etch themselves. The etch therefore "bypasses" these layers, and selectively etches the quantum well layers.

The etching current is monitored, and when the quantum wells are fully etched, etching is stopped before the n+-GaN and conductive n-GaN layers below the quantum wells are etched.

This method advantageously allows an LED structure to be grown and then etched in a single etching step, so that the quantum well layers are etched to form nanostructures, or quantum dots, without affecting the rest of the structure. This can be done even though the quantum well layers to be etched are buried in the LED structure between layers of p-type and n-type semiconductor material.

As discussed above, the etching of nanostructures in the quantum well layers creates a blue shift in the emission spectrum of the LED, which may be highly desirable for the manufacture of low-wavelength LEDs.

Figure 9B:
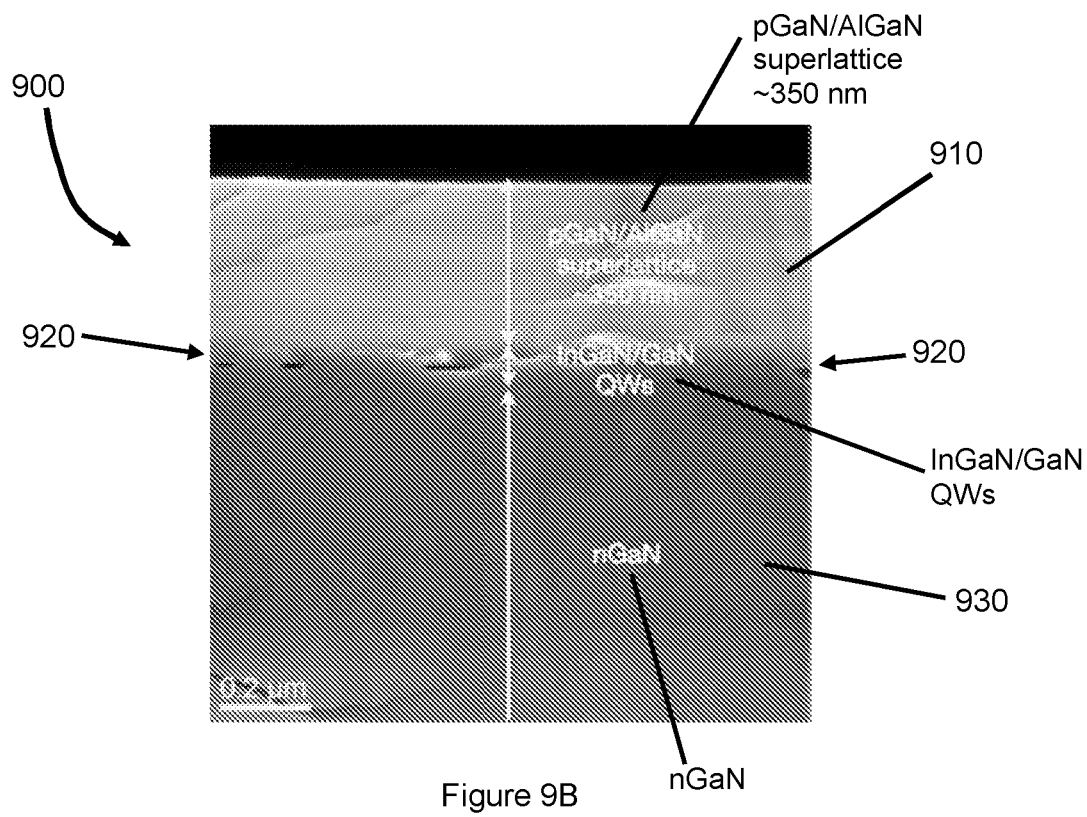
FIG. 9B shows a cross-sectional scanning electron microscopy (SEM) image of the LED structure of FIG. 9A, after etching according to the method of the present invention.

FIG. 9B shows a cross-sectional scanning electron microscopy (SEM) image of the LED structure of FIG. 9A, after etching according to the method of the present invention. FIG. 9B shows that the quantum well layers of the semiconductor structure have been selectively etched without porosifying the pGaN, n+GaN, and the nGaN layers of the structure, and without any damage to the other parts of the LED structure.

The etching method of the present invention may thus be used to etch nanostructures in the quantum wells of pre-formed LED semiconductor structures. Importantly, the through-surface etching technique of the present invention allows sub-surface quantum structures to be etched without etching, or otherwise damaging, the other parts of the structure.

The invention claimed is:

1. A method for porosifying a semiconductor structure comprising a sub-surface quantum structure of a first III-V semiconductor material, beneath a surface layer of a second III-V semiconductor material having a charge carrier density of less than $5\times10^{17}$ cm$^{-3}$, the method comprising the steps of:
    exposing the surface layer to an electrolyte; and
    applying a potential difference between the first III-V semiconductor material and the electrolyte, to electrochemically porosify the sub-surface quantum structure to form a plurality of nanostructures by electrochemical etching through the surface layer, while the surface layer is not porosified.

2. The method according to claim 1, in which the sub-surface quantum structure comprises a quantum well, or a quantum wire, or a quantum dot, and/or in which the plurality of nanostructures are three-dimensional nanostructures.

3. The method according to claim 1, in which the sub-surface quantum structure has one or more dimensions of less than or equal to 0.25 nm, or 0.5 nm, or 1 nm, or 2 nm, or 3 nm, or 5 nm, or 8 nm, or 10 nm, or 12 nm, and/or in which the sub-surface quantum structure has a minimum lateral dimension which is at least 5 times, or 10 times, or 50 times, or 100 times greater than a thickness of the sub-surface quantum structure.

4. The method according to claim 1, in which the semiconductor structure additionally comprises a further sub-surface structure of a third III-V semiconductor material having a charge carrier density of greater than $1\times10^{17}$ cm$^{-3}$.

5. The method according to claim 1, in which the sub-surface quantum structure of the first III-V semiconductor material has an electronic bandgap which is narrower than an electronic bandgap of semiconductor material adjacent to it in the semiconductor structure.

6. The method according to claim 1, in which one or more of the first III-V semiconductor material or the second III-V semiconductor material comprise III-nitride semiconductor materials.

7. The method according to claim 1, in which the sub-surface quantum structure has a charge carrier density greater than $1\times10^{17}$ cm$^{-3}$, or greater than $5\times10^{17}$ cm$^{-3}$, or in which the sub-surface quantum structure is undoped.

8. The method according to claim 1, in which both the surface layer and the sub-surface quantum structure have a threading dislocation density of at least $1\times10^4$ cm$^{-2}$, $1\times10^5$ cm$^{-2}$, $1\times10^6$ cm$^{-2}$, $1\times10^7$ cm$^{-2}$, or $1\times10^8$ cm$^{-2}$ and/or less than $1\times10^9$ cm$^{-2}$ or $1\times10^{10}$ cm$^{-2}$.

9. The method according to claim 1, in which a thickness of the surface layer is at least 40 nm, or 50 nm, or 100 nm, or 500 nm, and/or less than 1 μm, or 5 μm, or 10 μm.

10. The method according to claim 1, in which an outer surface of the surface layer has a minimum lateral dimension of at least 300 μm, or at least 500 μm, or at least 1 mm, or at least 10 mm, or at least 5 cm, or at least 15 cm, or at least 20 cm, and/or in which the sub-surface quantum structure has a minimum lateral dimension of at least 300 μm, or at least 500 μm, or at least 1 mm, or at least 10 mm, or at least 5 centimetres.

11. The method according to claim 1, in which the sub-surface quantum structure of the semiconductor structure comprises a plurality of sub-surface quantum structures formed from the first III-V semiconductor material.

12. The method according to claim 1, in which the semiconductor structure is provided as a wafer with a diameter of 1 inch (2.54 cm), or 2 inches (5.08 cm), or 6 inches (15.24 cm), or 8 inches (20.36 cm).

13. The method according to claim 1, in which the semiconductor structure is not pre-patterned with trenches, or in which the semiconductor structure is not pre-patterned with trenches separated by less than 1 cm, or 5 mm, or 1 mm, or 600 µm, or 400 µm, or 200 µm.

14. The method according to claim 1, in which the surface layer is not coated with an electrically insulating layer or other protective layer during the electrochemical etching, and/or in which the semiconductor structure is not illuminated by light having energy exceeding an electronic bandgap energy of the sub-surface quantum structure material during the electrochemical etching, or in which the semiconductor structure is not illuminated by a light source with a bandwidth of less than 20 nm, or less than 10 nm, or less than 5 nm during the electrochemical etching.

15. The method according to claim 1, in which the semiconductor structure is an LED structure, comprising a layer of p-type III-V semiconductor material arranged between the surface layer and the sub-surface quantum structure, and a layer of n-type III-V semiconductor material arranged beneath the sub-surface quantum structure.

16. A method for making an LED according to the method of claim 1, in which the semiconductor structure is an LED semiconductor structure.

17. The method according to claim 4, in which the sub-surface quantum structure is arranged between the surface layer and the further sub-surface structure of the third III-V material.

18. The method according to claim 4, in which the further sub-surface structure of the third III-V semiconductor material is a second sub-surface quantum structure.

19. The method according to claim 4, in which the charge carrier density of the third III-V semiconductor material is at least 5 times, or 10 times, or 100 times, or 1000 times, or 10,000 times, or 100,000 times, or 1,000,000 times higher than the charge carrier density in the surface layer.

20. The method according to claim 6, in which the III-nitride semiconductor materials are selected from the list consisting of: GaN, InN, AlGaN, InGaN, InAlN and AlInGaN.

21. The method according to claim 11, in which the semiconductor structure comprises a multiple quantum well (MQW) comprising a plurality of sub-surface quantum well layers arranged in a stack, and separated by intermediate barrier layers of III-V semiconductor material, in which an electronic bandgap of the plurality of sub-surface quantum wells is smaller than a bandgap of the intermediate barrier layers.

22. The method according to claim 21, in which the plurality of sub-surface quantum wells is sequentially porosified from the surface layer down.

23. The method according to claim 22, further comprising controlling a porosity of a selected sub-surface quantum well by controlling a potential difference between the electrolyte and the selected sub-surface quantum well during the electrochemical etching.

* * * * *